(12) United States Patent
Chaves et al.

(10) Patent No.: US 7,753,561 B2
(45) Date of Patent: Jul. 13, 2010

(54) OPTICAL DEVICE FOR LED-BASED LAMP

(75) Inventors: Julio Cesar Chaves, Madrid (ES); Juan Carlos Minano, Madrid (ES); Pablo Benitez, Madrid (ES); William A Parkyn, Jr., Lomita, CA (US); Waqidi Falicoff, Newport Beach, CA (US); Fernando Munoz, Madrid (ES); Yupin Sun, Yorba Linda, CA (US)

(73) Assignee: Light Prescriptions Innovators, LLC, Irvine, CA (US)

( * ) Notice: Subject to any disclaimer, the term of this patent is extended or adjusted under 35 U.S.C. 154(b) by 0 days.

(21) Appl. No.: 11/970,462

(22) Filed: Jan. 7, 2008

(65) Prior Publication Data
US 2008/0123349 A1 May 29, 2008

Related U.S. Application Data

(60) Division of application No. 10/816,228, filed on Mar. 31, 2004, now Pat. No. 7,329,029, which is a continuation-in-part of application No. 10/814,598, filed on Mar. 30, 2004, now abandoned, and a continuation-in-part of application No. 10/461,557, filed on Jun. 12, 2003, now Pat. No. 7,021,797.

(60) Provisional application No. 60/470,691, filed on May 13, 2003, provisional application No. 60/520,951, filed on Nov. 17, 2003.

(51) Int. Cl.
*F21V 7/04* (2006.01)
(52) U.S. Cl. .................. 362/308; 362/304; 362/311.06; 362/296.05; 362/329
(58) Field of Classification Search ......... 362/327–329, 362/335, 338–340, 307–310, 304, 311.06, 362/296.05
See application file for complete search history.

(56) References Cited

U.S. PATENT DOCUMENTS 1,399,973 A 12/1921 Limpert (Continued)

FOREIGN PATENT DOCUMENTS

EP 0 450 560 A2 10/1991

(Continued)

OTHER PUBLICATIONS

European Search Report, Supplementary European Search Report from EP04752067 mailed May 8, 2008, 5 pages.

(Continued)

*Primary Examiner*—Thomas M Sember
(74) *Attorney, Agent, or Firm*—Thomas F. Lebens; Sinsheimer Juhnke Lebens & McIvor, LLP

(57) ABSTRACT

An optical device for coupling the luminous output of a light-emitting diode (LED) to a predominantly spherical pattern comprises a transfer section that receives the LED's light within it and an ejector positioned adjacent the transfer section to receive light from the transfer section and spread the light generally spherically. A base of the transfer section is optically aligned and/or coupled to the LED so that the LED's light enters the transfer section. The transfer section can comprises a compound elliptic concentrator operating via total internal reflection. The ejector section can have a variety of shapes, and can have diffusive features on its surface as well. The transfer section can in some implementations be polygonal, V-grooved, faceted and other configurations.

13 Claims, 34 Drawing Sheets

U.S. PATENT DOCUMENTS

| | | |
|---|---|---|
| 1,977,689 A | 10/1934 | Muller |
| 2,254,961 A | 9/1941 | Harris |
| 2,362,176 A | 11/1944 | Swanson |
| 2,908,197 A | 10/1959 | Wells et al. |
| 3,760,237 A | 9/1973 | Jaffe |
| 3,774,021 A | 11/1973 | Johnson |
| 3,938,177 A | 2/1976 | Hansen et al. |
| 4,188,111 A | 2/1980 | Marvin |
| 4,192,994 A | 3/1980 | Kastner |
| 4,211,955 A | 7/1980 | Ray |
| 4,337,759 A | 7/1982 | Popovich et al. |
| 4,342,908 A | 8/1982 | Henningsen et al. |
| 4,384,769 A | 5/1983 | Brei et al. |
| 4,388,673 A | 6/1983 | Maglica |
| 4,464,707 A | 8/1984 | Forrest |
| 4,638,343 A | 1/1987 | Althaus et al. |
| 4,675,725 A | 6/1987 | Parkyn |
| 4,698,730 A | 10/1987 | Sakai et al. |
| 4,709,312 A | 11/1987 | Heinisch et al. |
| 4,727,289 A | 2/1988 | Uchida |
| 4,727,457 A | 2/1988 | Thillays |
| 4,839,781 A | 6/1989 | Barnes et al. |
| 4,920,404 A | 4/1990 | Shrimali et al. |
| 5,055,892 A | 10/1991 | Gardner et al. |
| 5,140,220 A | 8/1992 | Hasegawa |
| 5,302,778 A | 4/1994 | Maurinus |
| 5,335,157 A | 8/1994 | Lyons |
| 5,343,330 A | 8/1994 | Hoffman et al. |
| 5,404,282 A | 4/1995 | Klinke et al. |
| 5,404,869 A | 4/1995 | Parkyn, Jr. et al. |
| 5,438,453 A | 8/1995 | Kuga |
| 5,444,606 A * | 8/1995 | Barnes et al. ............... 362/340 |
| 5,452,190 A | 9/1995 | Priesemuth |
| 5,453,877 A | 9/1995 | Gerbe et al. |
| 5,481,445 A * | 1/1996 | Sitzema et al. ............. 362/308 |
| 5,528,474 A | 6/1996 | Roney et al. |
| 5,557,471 A | 9/1996 | Fernandez |
| 5,577,492 A | 11/1996 | Parkyn et al. |
| 5,580,142 A | 12/1996 | Kurematsu et al. |
| 5,600,487 A | 2/1997 | Kiyomoto et al. |
| 5,608,290 A | 3/1997 | Hutchisson et al. |
| 5,613,769 A | 3/1997 | Parkyn et al. |
| 5,655,830 A | 8/1997 | Ruskouski |
| 5,655,832 A | 8/1997 | Pelka et al. |
| 5,676,453 A | 10/1997 | Parkyn, Jr. et al. |
| 5,699,186 A | 12/1997 | Richard |
| 5,757,557 A | 5/1998 | Medvedev |
| 5,777,433 A | 7/1998 | Lester et al. |
| 5,806,955 A | 9/1998 | Parkyn, Jr. et al. |
| 5,813,743 A | 9/1998 | Naka |
| 5,865,529 A | 2/1999 | Yan |
| 5,894,195 A | 4/1999 | McDermott |
| 5,894,196 A | 4/1999 | McDermott |
| 5,897,201 A | 4/1999 | Simon |
| 5,898,267 A | 4/1999 | McDermott |
| 5,898,809 A | 4/1999 | Taboada et al. |
| 5,924,788 A | 7/1999 | Parkyn |
| 5,926,320 A | 7/1999 | Parkyn et al. |
| 5,966,250 A | 10/1999 | Shimizu |
| 6,019,493 A | 2/2000 | Kuo et al. |
| 6,030,099 A | 2/2000 | McDermott |
| 6,044,196 A | 3/2000 | Winston et al. |
| 6,048,083 A | 4/2000 | McDermott |
| 6,097,549 A | 8/2000 | Jenkins et al. |
| 6,139,166 A | 10/2000 | Marshall et al. |
| 6,166,860 A | 12/2000 | Medvedev et al. |
| 6,166,866 A | 12/2000 | Kimura et al. |
| 6,177,761 B1 | 1/2001 | Pelka et al. |
| 6,181,476 B1 | 1/2001 | Medvedev |
| 6,201,229 B1 | 3/2001 | Tawa et al. |
| 6,222,623 B1 | 4/2001 | Wetherell |
| 6,252,636 B1 | 6/2001 | Bartlett |
| 6,268,963 B1 | 7/2001 | Akiyama |
| 6,273,596 B1 | 8/2001 | Parkyn |
| 6,282,821 B1 | 9/2001 | Freier |
| 6,301,064 B1 | 10/2001 | Araki et al. |
| 6,336,734 B1 * | 1/2002 | Arumugasaamy ........... 362/309 |
| 6,350,041 B1 | 2/2002 | Tarsa et al. |
| 6,356,700 B1 | 3/2002 | Strobel |
| 6,361,190 B1 | 3/2002 | McDermott |
| 6,450,661 B1 | 9/2002 | Okumura |
| 6,473,554 B1 | 10/2002 | Pelka et al. |
| 6,483,976 B2 | 11/2002 | Shie et al. |
| 6,488,392 B1 | 12/2002 | Lu |
| 6,494,596 B1 * | 12/2002 | Burroughs ................... 362/348 |
| 6,502,964 B1 | 1/2003 | Simon |
| 6,504,301 B1 | 1/2003 | Lowery |
| 6,536,921 B1 * | 3/2003 | Simon ........................ 362/277 |
| 6,536,923 B1 | 3/2003 | Merz |
| 6,547,400 B1 | 4/2003 | Yokoyama |
| 6,547,423 B2 | 4/2003 | Marshall et al. |
| 6,554,455 B2 | 4/2003 | Perlo et al. |
| 6,560,038 B1 | 5/2003 | Parkyn et al. |
| 6,578,989 B2 | 6/2003 | Osumi et al. |
| 6,580,228 B1 | 6/2003 | Chen et al. |
| 6,582,103 B1 | 6/2003 | Popovich et al. |
| 6,598,998 B2 | 7/2003 | West et al. |
| 6,603,243 B2 | 8/2003 | Parkyn et al. |
| 6,607,286 B2 | 8/2003 | West et al. |
| 6,616,287 B2 | 9/2003 | Sekita et al. |
| 6,621,222 B1 | 9/2003 | Hong |
| 6,637,924 B2 | 10/2003 | Pelka et al. |
| 6,639,733 B2 | 10/2003 | Minano et al. |
| 6,641,287 B2 | 11/2003 | Suehiro |
| 6,646,813 B2 | 11/2003 | Falicoff |
| 6,647,199 B1 | 11/2003 | Pelka et al. |
| 6,674,096 B2 | 1/2004 | Sommers |
| 6,679,621 B2 | 1/2004 | West et al. |
| 6,688,758 B2 | 2/2004 | Thibault |
| 6,692,136 B2 | 2/2004 | Marshall et al. |
| 6,729,746 B2 | 5/2004 | Suehiro et al. |
| 6,755,556 B2 * | 6/2004 | Gasquet et al. ............. 362/329 |
| 6,769,772 B2 | 8/2004 | Roddy et al. |
| 6,783,269 B2 | 8/2004 | Pashley |
| 6,786,619 B2 * | 9/2004 | Subisak et al. ............. 362/308 |
| 6,786,625 B2 | 9/2004 | Wesson |
| 6,796,698 B2 | 9/2004 | Sommers et al. |
| 6,803,607 B1 | 10/2004 | Chan et al. |
| 6,811,277 B2 | 11/2004 | Amano |
| 6,830,359 B2 | 12/2004 | Fleury |
| 6,848,820 B2 | 2/2005 | Natsume |
| 6,863,402 B2 | 3/2005 | Roddy et al. |
| 6,882,379 B1 | 4/2005 | Yokoyama et al. |
| 6,886,962 B2 | 5/2005 | Suehiro |
| 6,924,943 B2 | 8/2005 | Minano et al. |
| 6,926,435 B2 | 8/2005 | Li |
| 6,948,836 B2 | 9/2005 | Ishida et al. |
| 6,953,265 B2 | 10/2005 | Suehiro et al. |
| 6,997,587 B2 | 2/2006 | Albou |
| 7,021,797 B2 | 4/2006 | Minano et al. |
| 7,160,002 B2 * | 1/2007 | Simon ........................ 362/299 |
| 7,329,029 B2 | 2/2008 | Chavez et al. |
| 2002/0034012 A1 | 3/2002 | Santoro et al. |
| 2002/0080623 A1 | 6/2002 | Pashley |
| 2002/0185651 A1 | 12/2002 | Sommers |
| 2003/0076034 A1 | 4/2003 | Marshall |
| 2004/0080947 A1 * | 4/2004 | Subisak et al. ............. 362/311 |
| 2004/0125614 A1 | 7/2004 | Ishida et al. |
| 2004/0190304 A1 | 9/2004 | Sugimoto et al. |
| 2005/0024744 A1 | 2/2005 | Falicoff |
| 2005/0086032 A1 | 4/2005 | Benitez et al. |
| 2005/0088758 A1 | 4/2005 | Minano et al. |
| 2005/0117125 A1 | 6/2005 | Minano et al. |
| 2005/0129358 A1 | 6/2005 | Minano et al. |

| | | | |
|---|---|---|---|
| 2005/0135095 | A1 | 6/2005 | Geissler |
| 2005/0200812 | A1 | 9/2005 | Sakata et al. |
| 2005/0219464 | A1 | 10/2005 | Yamasaki et al. |
| 2005/0225988 | A1 | 10/2005 | Chavez |

FOREIGN PATENT DOCUMENTS

| | | |
|---|---|---|
| ES | 2142752 B1 | 12/2000 |
| SU | 1282051 A1 | 1/1987 |
| WO | WO 99/09349 A1 | 2/1999 |
| WO | WO 99/13266 A1 | 3/1999 |
| WO | WO-99/15826 | 4/1999 |
| WO | WO 01/07828 A1 | 2/2001 |
| WO | WO-01/35128 | 5/2001 |
| WO | WO-01/40702 | 6/2001 |
| WO | WO 03/066374 A2 | 8/2003 |
| WO | WO 03/066374 A3 | 8/2003 |
| WO | WO-03/071352 | 8/2003 |
| WO | WO 2004/007241 A2 | 1/2004 |

OTHER PUBLICATIONS

Eurpean Patent Office, European Search Report dated May 19, 2008, 5 pages (replacement of May 8, 2008 Search Report).
Eurpoean Patent Office, Examination Report for EP Application No. 04750671 mailed Aug. 28, 2008, 6 pages.
U.S. Appl. No. 10/726,130, filed Dec. 1, 2003, Minano et al.
U.S. Appl. No. 10/814,598, filed Mar. 30, 2004, Chavez et al.
U.S. Appl. No. 10/816,228, filed Mar. 31, 2004, Chavez et al.
U.S. Appl. No. 10/851,471, filed May 21, 2004, Benitez.
U.S. Appl. No. 10/903,925, filed Jul. 29, 2004, Falicoff.
International Preliminary Report on Patentability for PCT/US04/38584 mailed Aug. 21, 2006.
International Search Report and Written Opinion for PCT/US04/38162 mailed Nov. 30, 2005.
International Search Report for PCT/US03/38024 mailed Nov. 10, 2004.
International Search Report for PCT/US04/24450 mailed Aug. 3, 2005.
International Search Report for PCT/US04/38584 mailed Jul. 18, 2005.
International Search Report for PCT/US03/38240 mailed Jul. 26, 2004.
International Search Report, PCT/US04/14938 mailed Mar. 1, 2005.
International Search Report for PCT/US03/32076 mailed Apr. 20, 2004.
Office action from U.S. Appl. No. 10/461,557 dated Feb. 10, 2005.
Restriction Requirement from U.S. Appl. No. 10/461,557 dated Nov. 24, 2004.
Notice of Allowance from U.S. Appl. No. 10/461,557 dated Aug. 8, 2005.
Notice of Allowance from U.S. Appl. No. 10/461,557 dated Jan. 10, 2006.
Examiner Interview Summary from U.S. Appl. No. 10/461,557 dated Aug. 5, 2005.
Notice of Allowance from U.S. Appl. No. 10/816,228 dated Sep. 14, 2007.
Office action from U.S. Appl. No. 10/816,228 dated Jun. 12, 2007.
Restriction Requirement from U.S. Appl. No. 10/816,228 dated Jun. 12, 2007.
Examiner Interview Summary from U.S. Appl. No. 10/816,228 dated Apr. 5, 2007.
Office action from U.S. Appl. No. 10/816,228 dated Dec. 13, 2006.
Office Action from U.S. Appl. No. 10/816,228 dated Mar. 31, 2006.
"Hyper ARGUS LED, Hyper-Bright 3mm (T1) LED, Non Diffused"; Infineon Technologies OSRAM; Mar. 1, 2000; 9 pages.
Benitez, P. et al.; "Chapter 6: The SMS Design Method in Three Dimensions", *Conceptos Avanzados de Optica Anidolica: Diseno y Fabricacion*; PhD dissertation; UPM 1998; 17 pages.
Benitez, P. et al.; "Design in 3D Geometry with the Simultaneous Multiple Surface Design Method of Nonimaging Optics"; Part of the SPIE Conference on Nonimaging Optics: Maximum Efficiency Light Transfer V; Denver, CO; Jul. 1999; pp. 12-21.
Glaeser, G. et al.; "Reflections on Refractions"; AMS; Sep. 5, 2001; 18 pages.
Parkyn, W. et al.; "The Black Hole: Cuspated waveguide-injectors and illuminators for LEDs"; Part of the SPIE Conference on Nonimaging Optics: Maximum Efficiency Light Transfer V; Denver, CO; Jul. 1999; pp. 183-189.
Remillard, J. et al.; "Loss Mechanisms Optical Light Pipes"; Applied Optics, vol. 31 No. 34; Dec. 1, 1992; pp. 7232-7241.
Spigulis, J. et al., "Compact Dielectric Reflective Elements. I. Half Sphere Concentrators of Radially Emitted Light"; Applied Optics, vol. 33 No. 25; Sep. 1, 1994; pp. 6970-6974.
Winston, R. et al.; "NonImaging Optics", Elsevier Academic Press; Burlington, MA, USA; 2005; 509 pages.
International Search Report for PCTUS0414938 mailed May 26, 2005.
European Patent Office Examination Report from 047520671 mailed Feb. 10, 2009.

\* cited by examiner

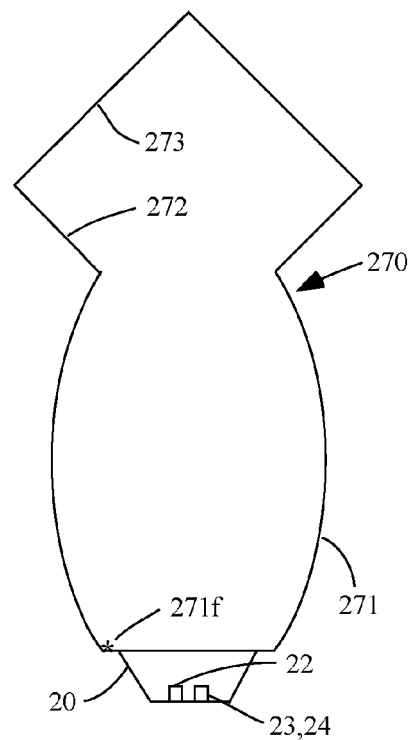
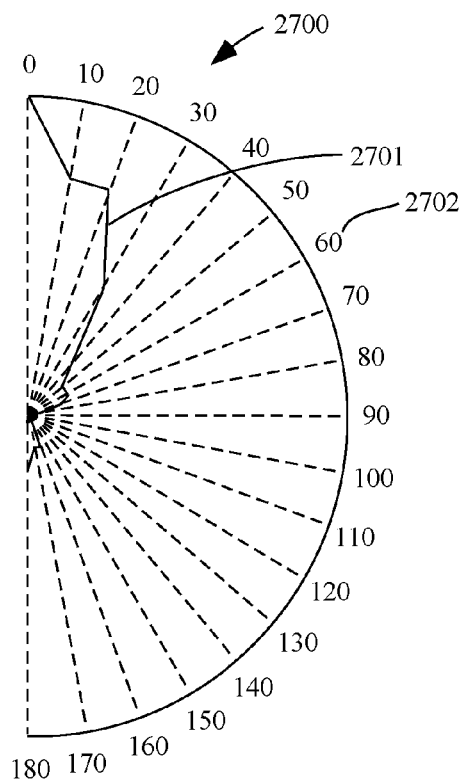
Fig. 1A  Fig. 1B
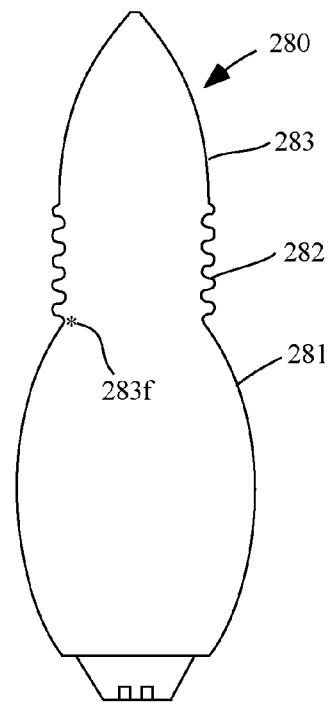
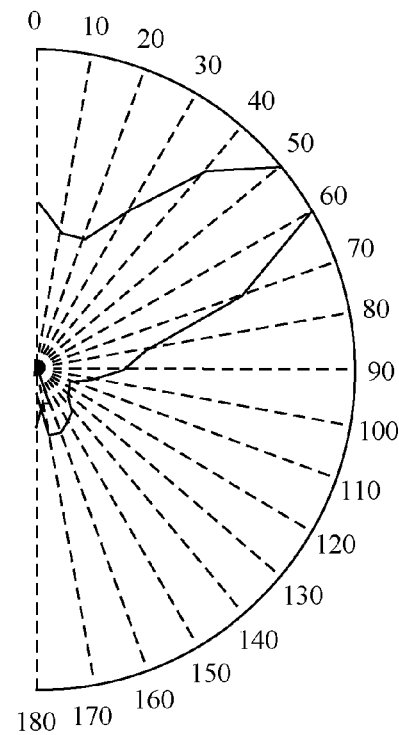
Fig. 2A  Fig. 2B

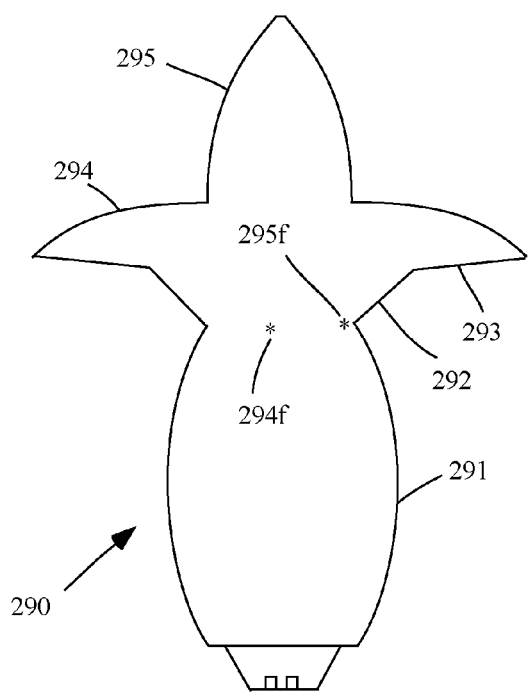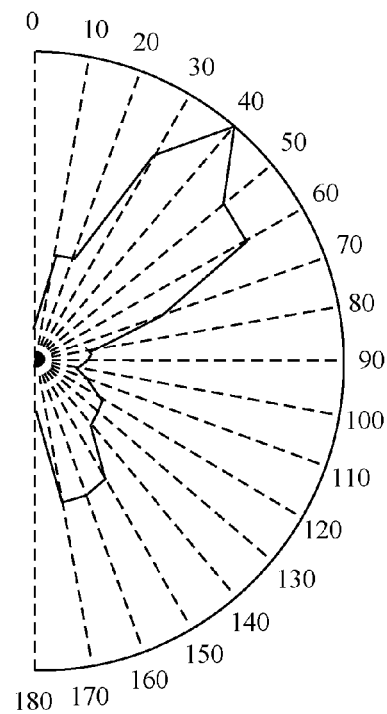
Fig. 3A  Fig. 3B
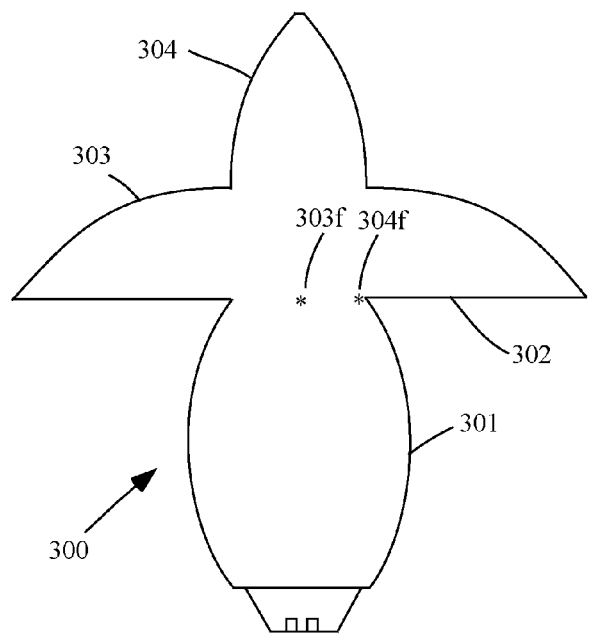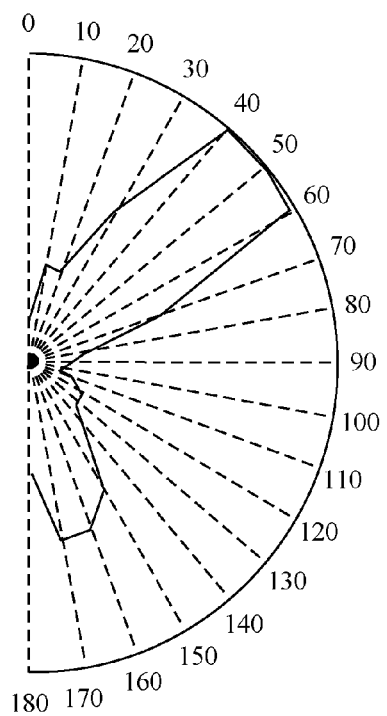
Fig. 4A  Fig. 4B

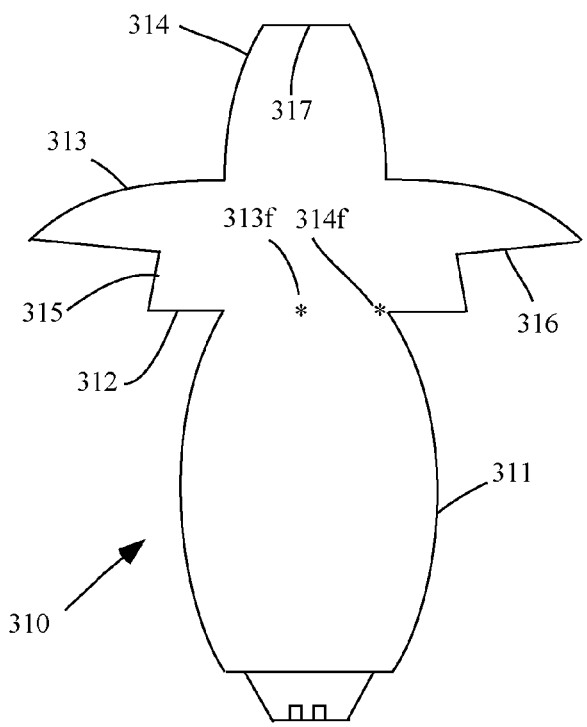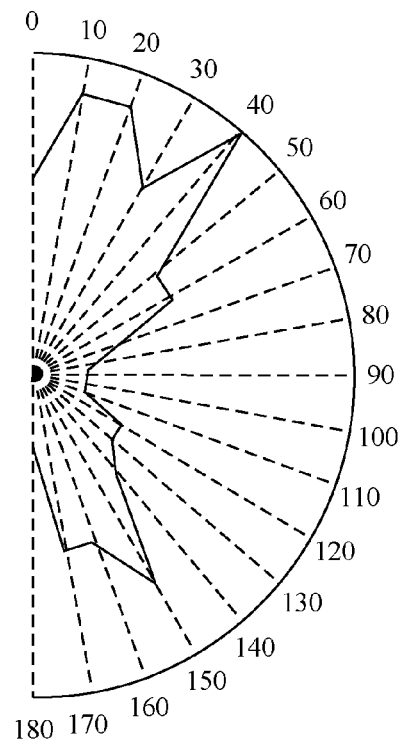
Fig. 5A  Fig. 5B
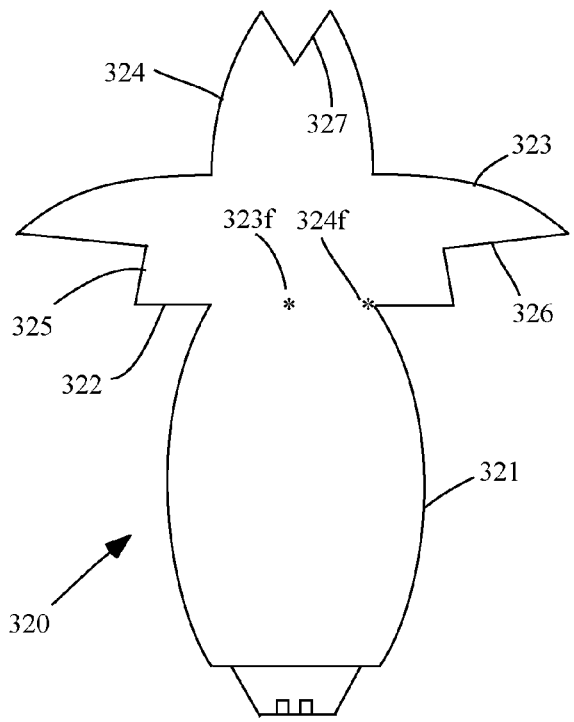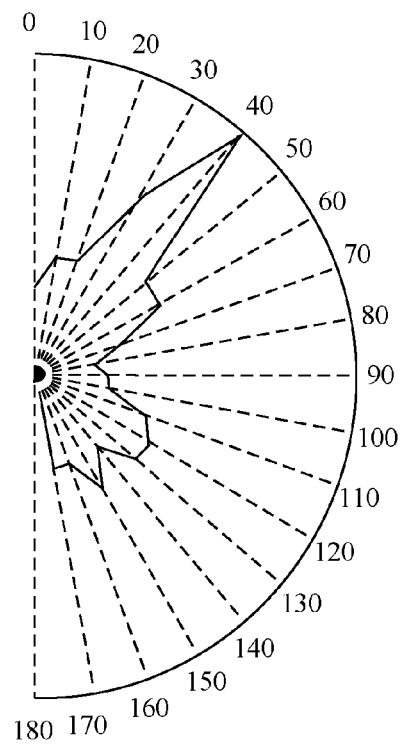
Fig. 6A  Fig. 6B

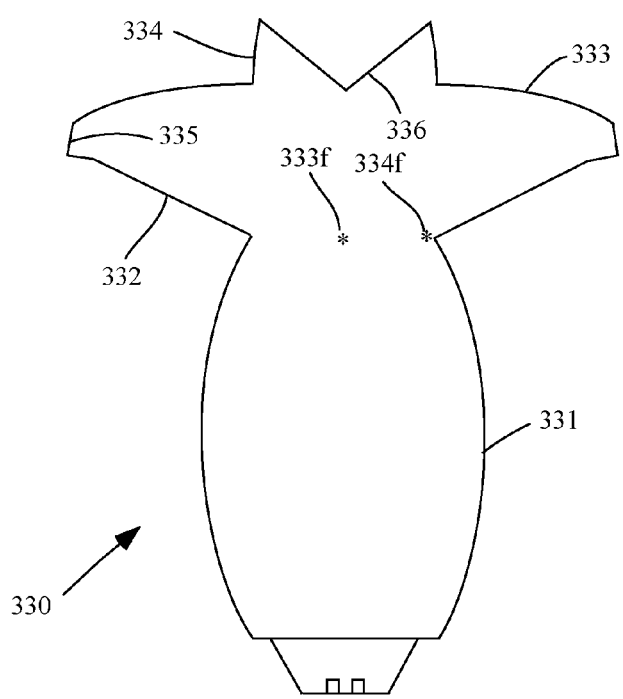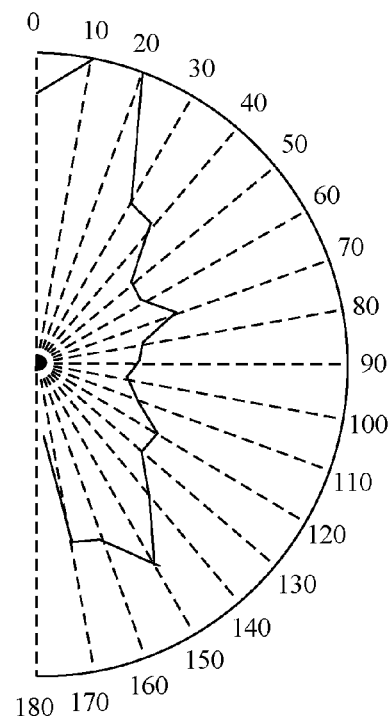
Fig. 7A  Fig. 7B
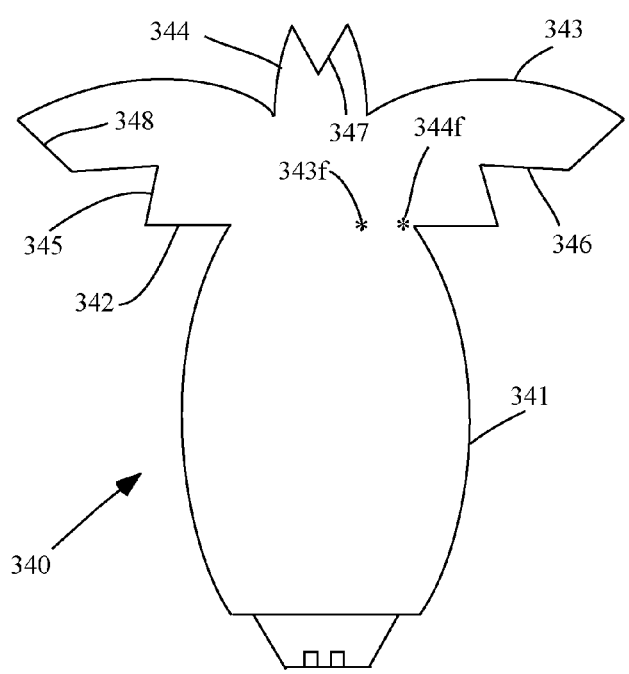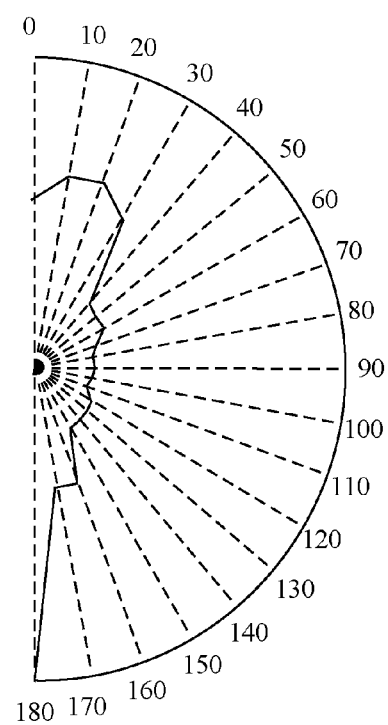
Fig. 8A  Fig. 8B

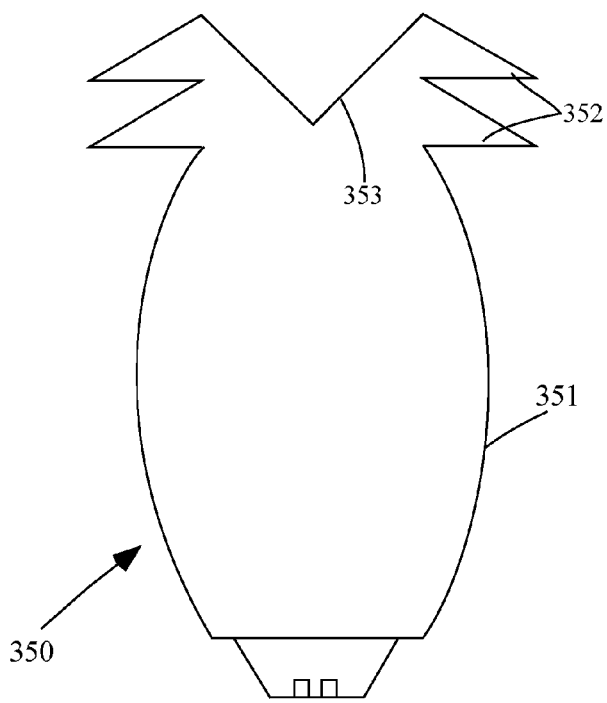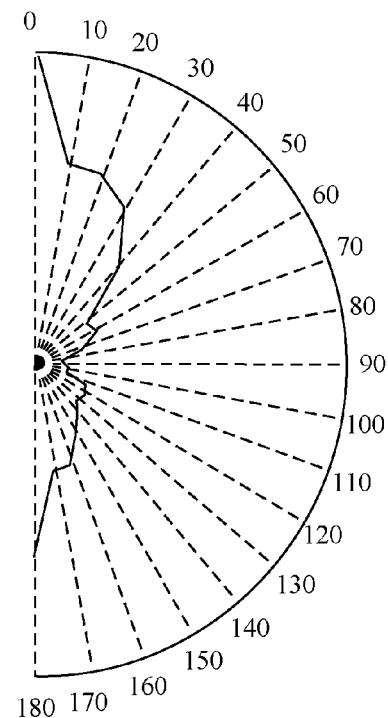
Fig. 9A    Fig. 9B
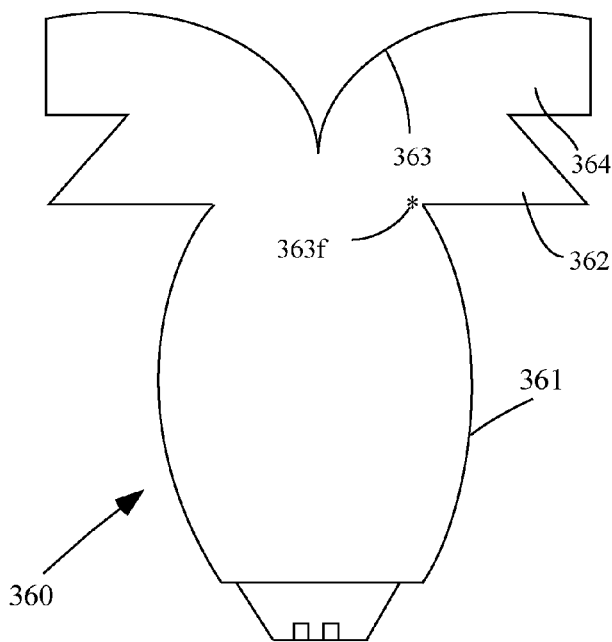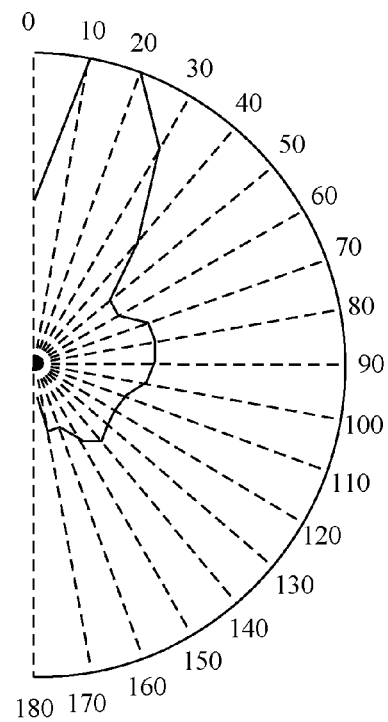
Fig. 10A    Fig. 10B

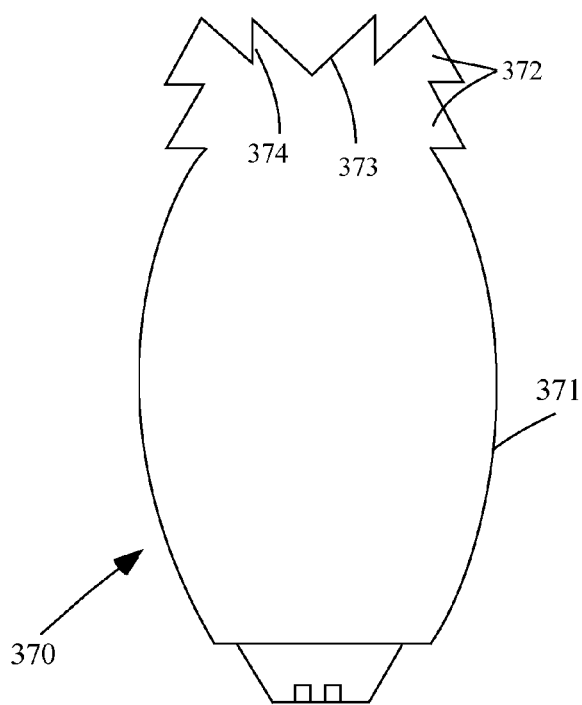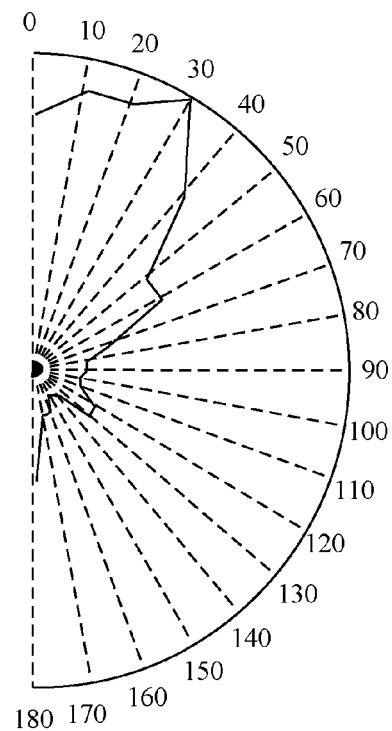
Fig. 11A　　Fig. 11B
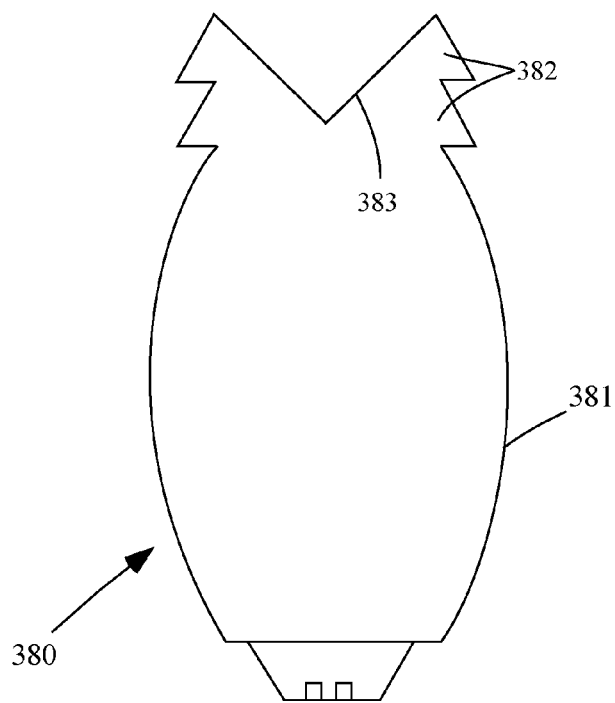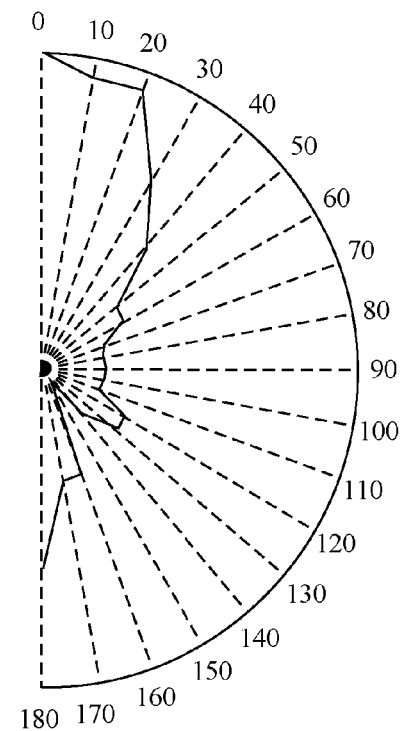
Fig. 12A　　Fig. 12B

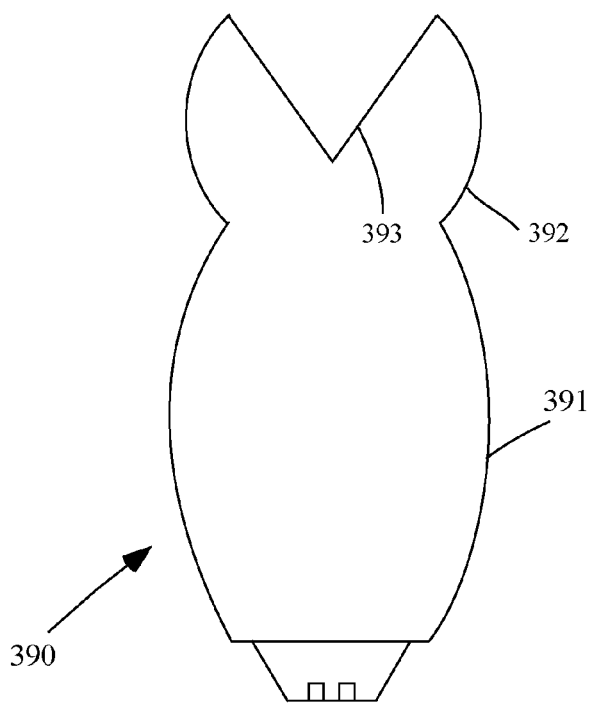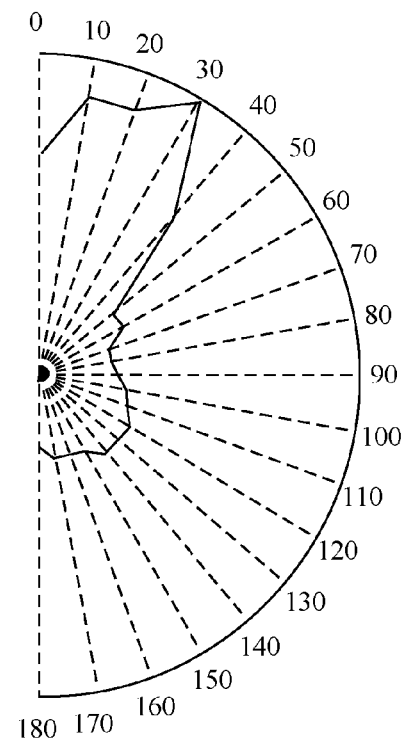
Fig. 13A  Fig. 13B
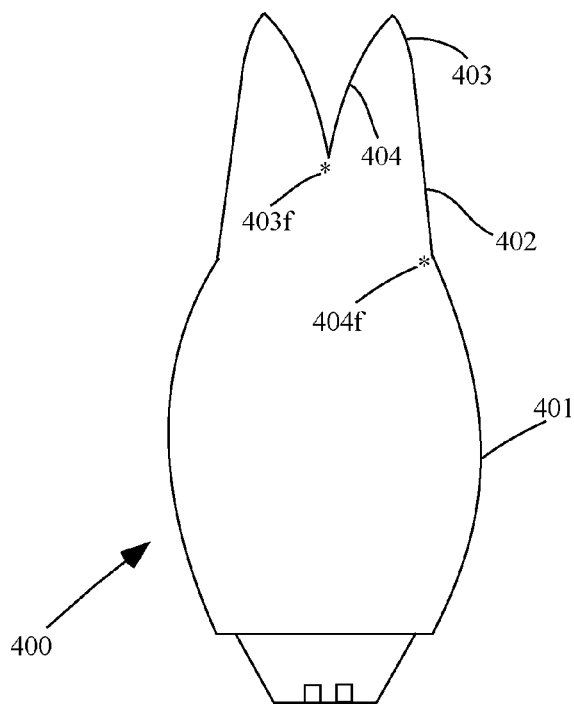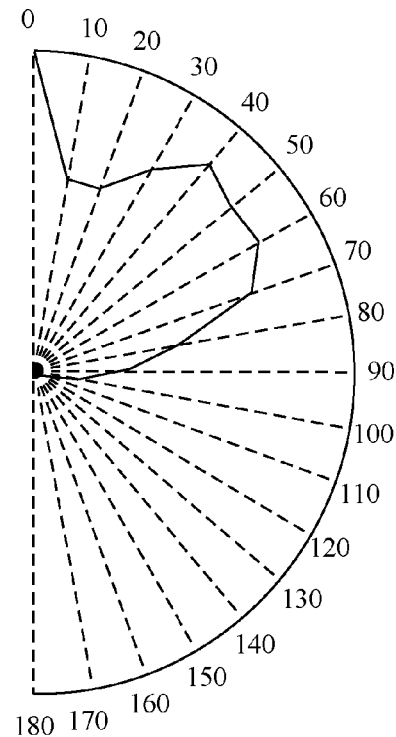
Fig. 14A  Fig. 14B

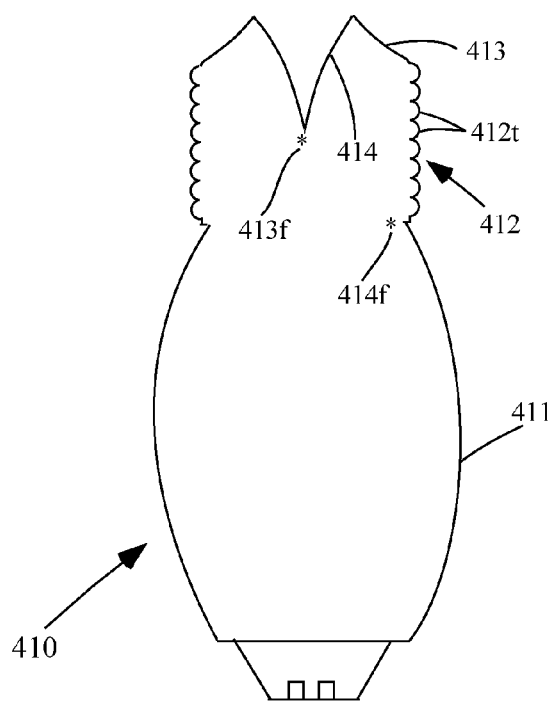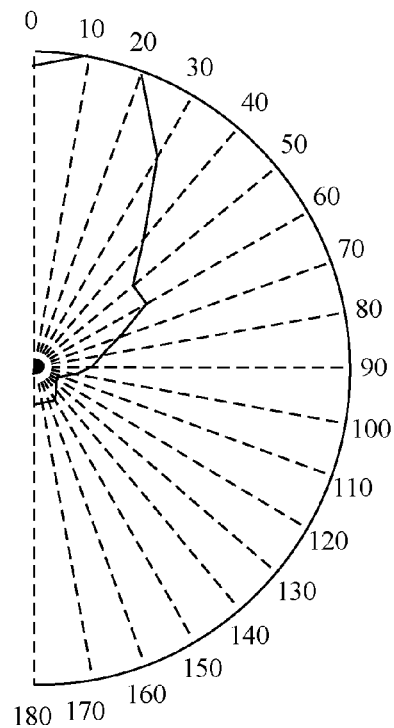
Fig. 15A    Fig. 15B
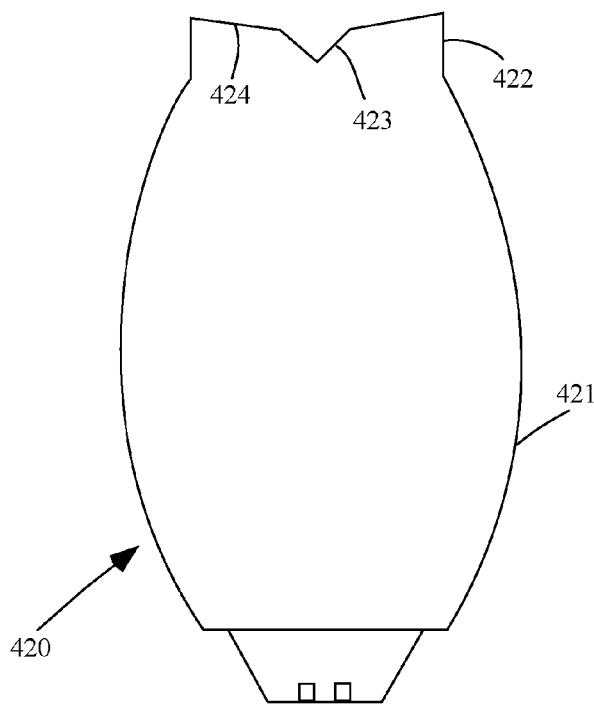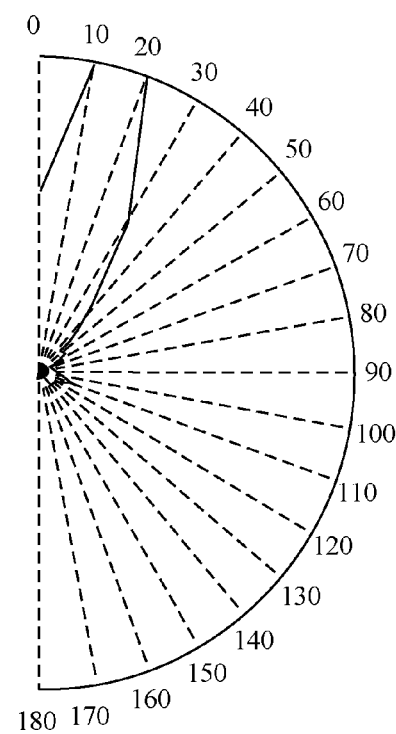
Fig. 16A    Fig. 16B

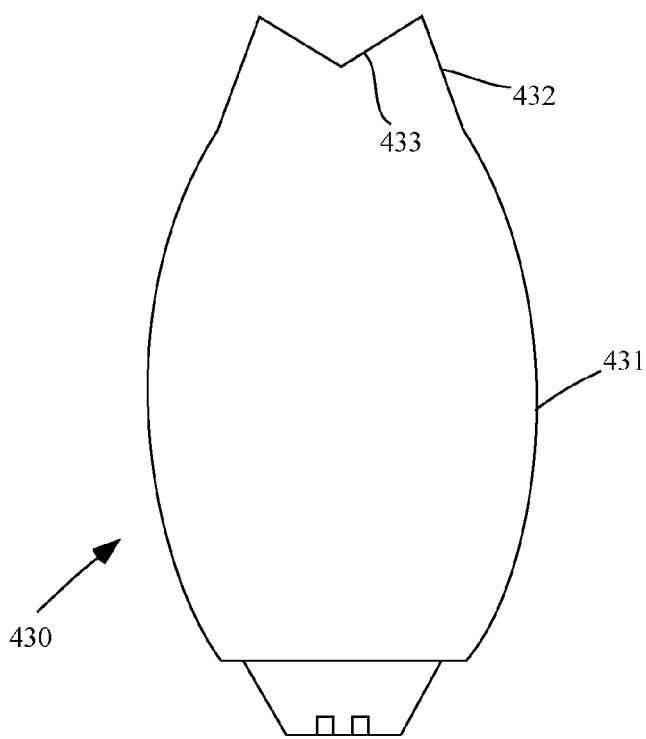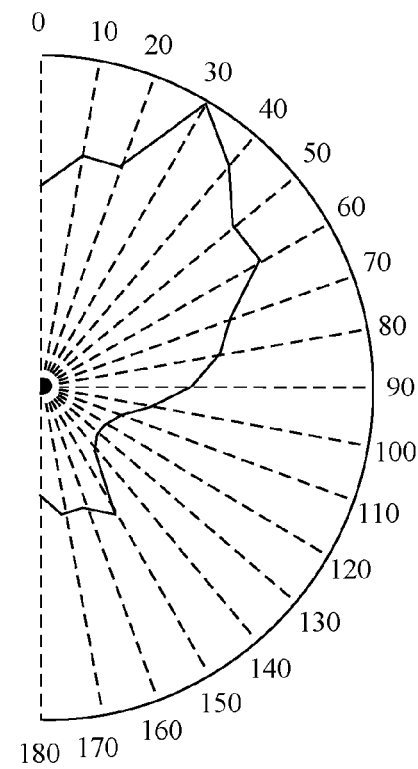
Fig. 17A　　　　Fig. 17B
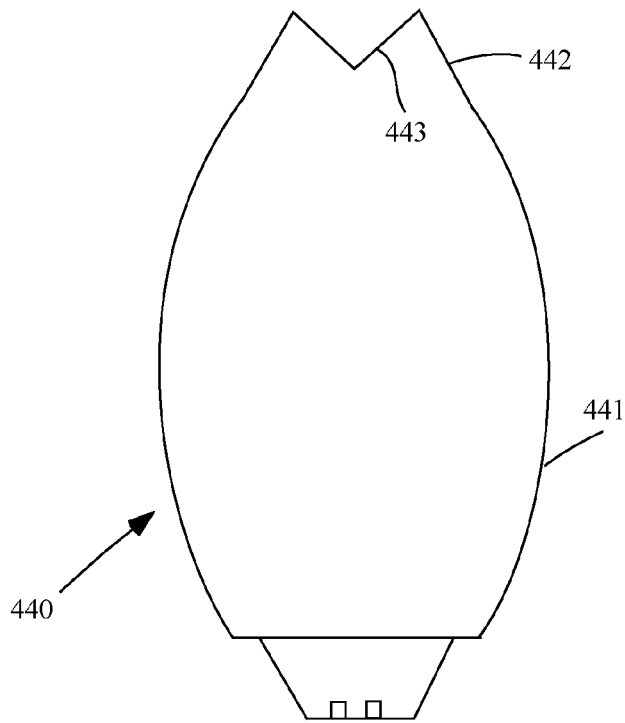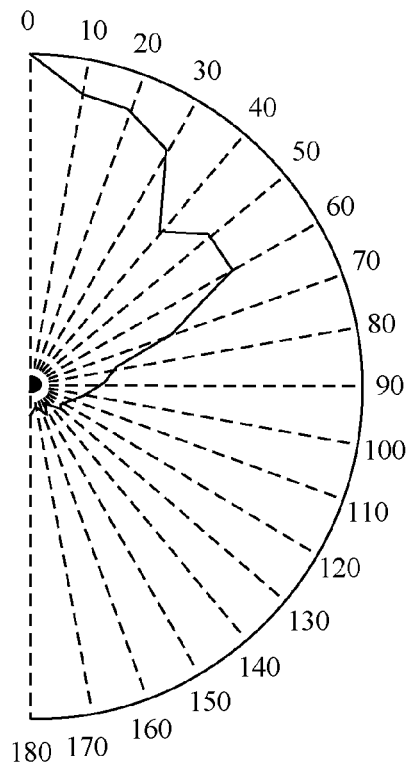
Fig. 18A　　　　Fig. 18B

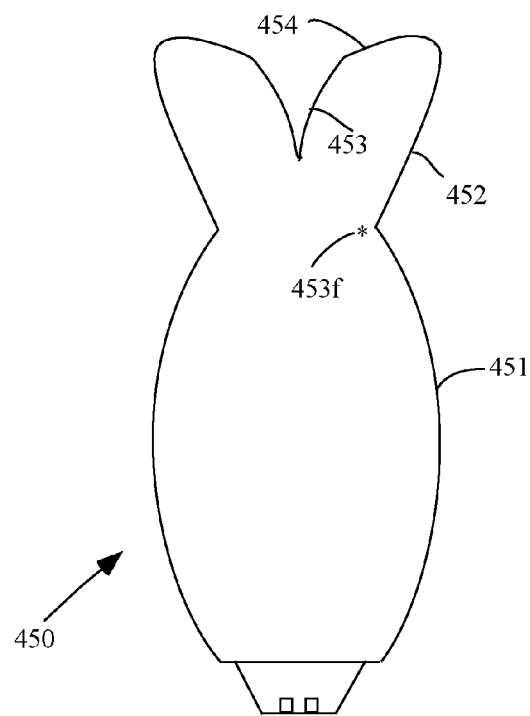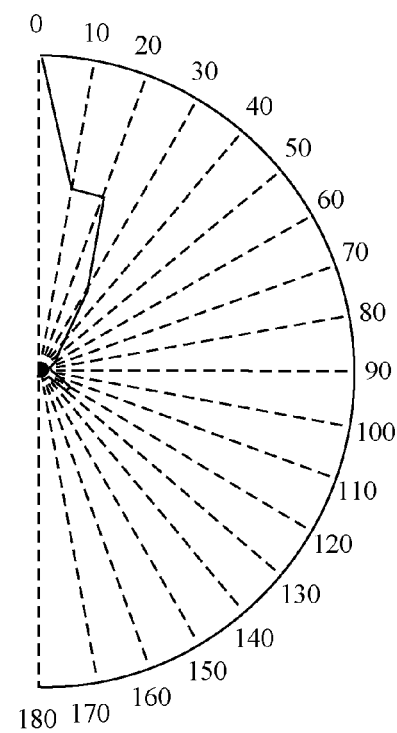
Fig. 19A　　　Fig. 19B
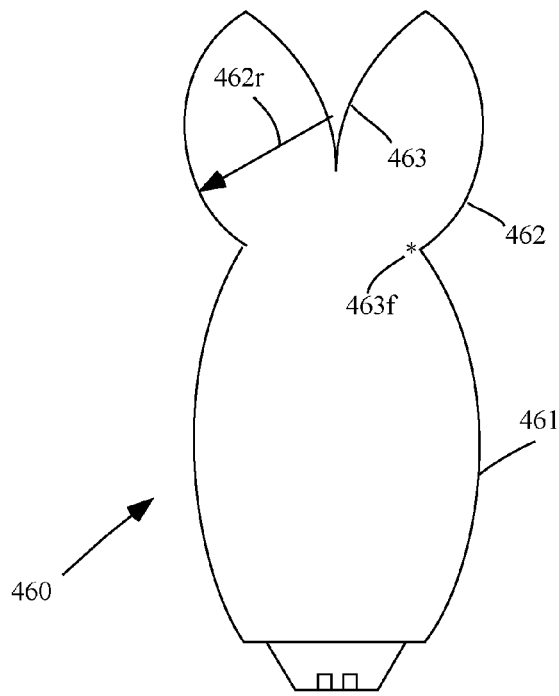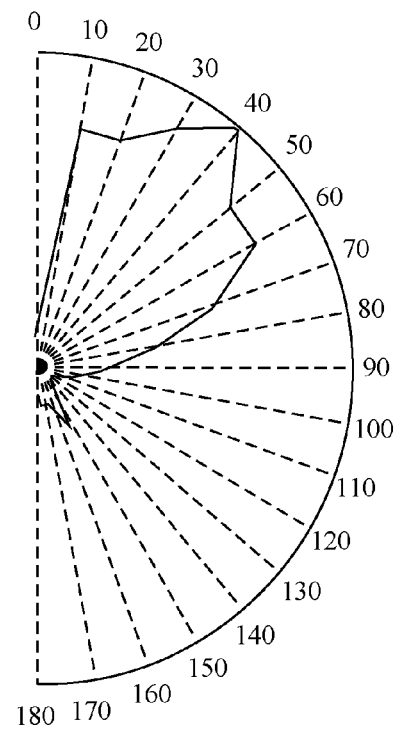
Fig. 20A　　　Fig. 20B

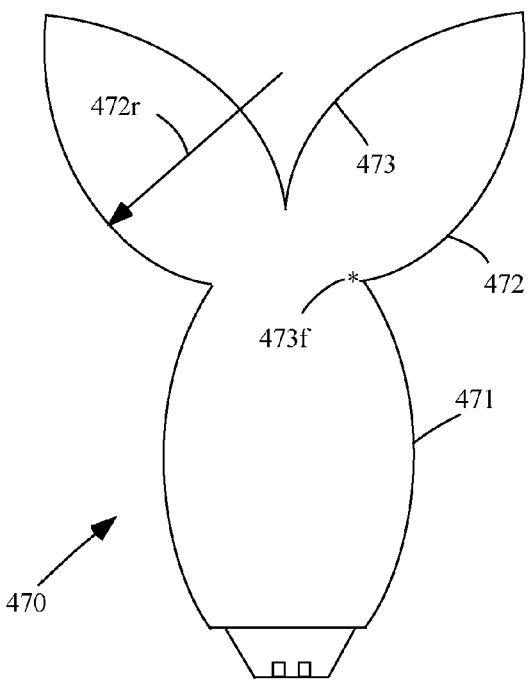 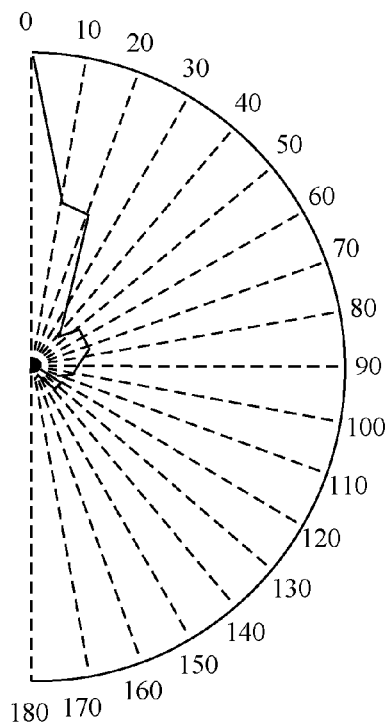
Fig. 21A Fig. 21B
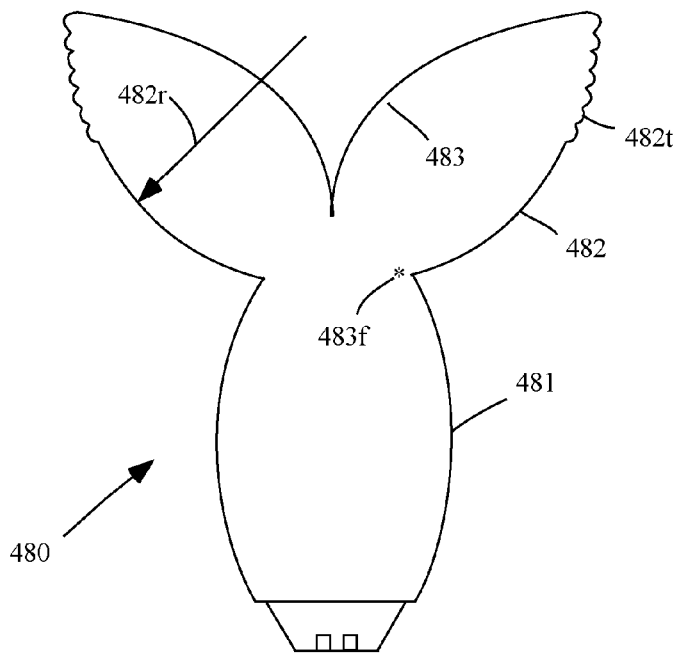 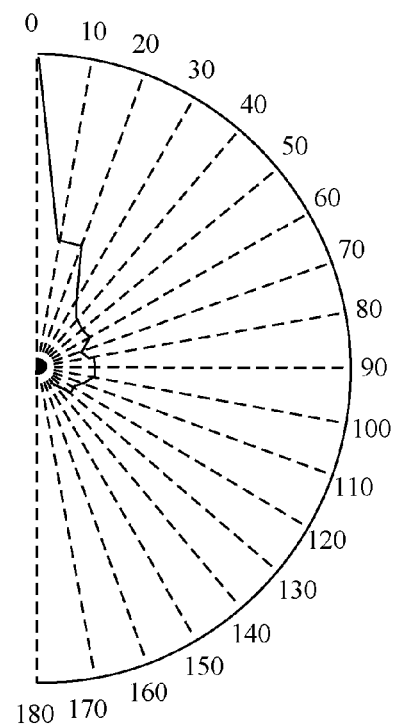
Fig. 22A Fig. 22B

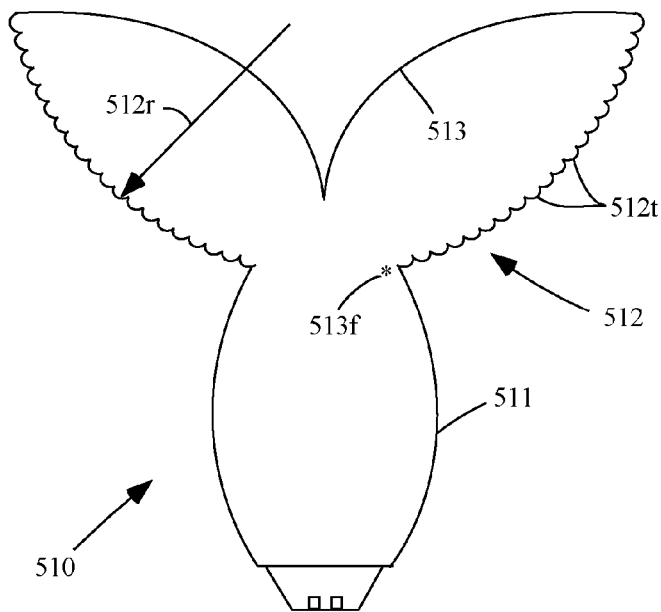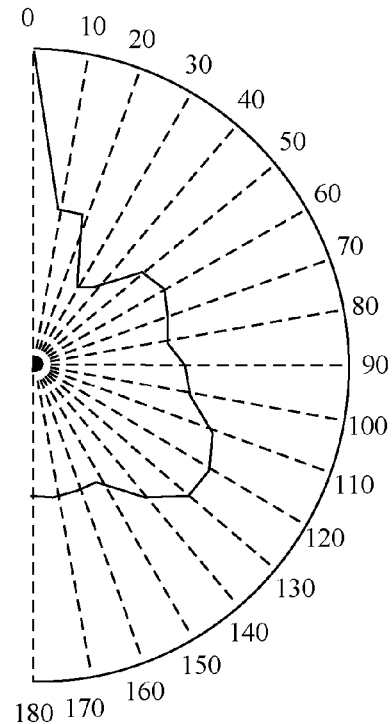
Fig. 25A        Fig. 25B
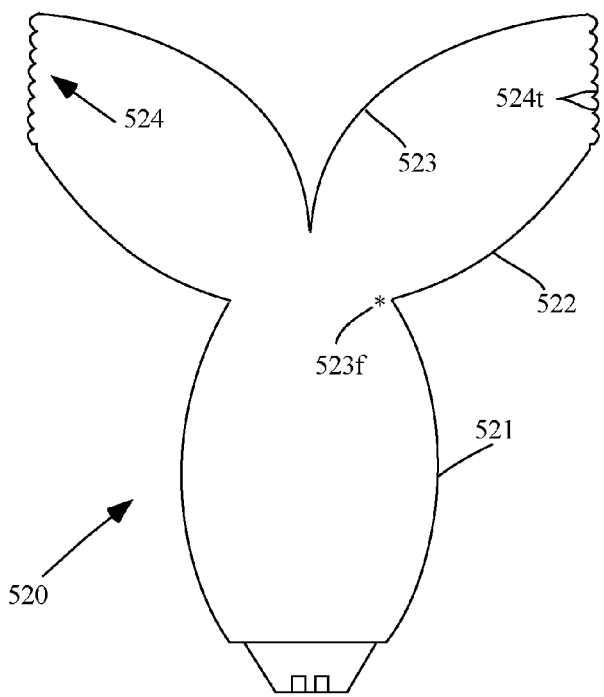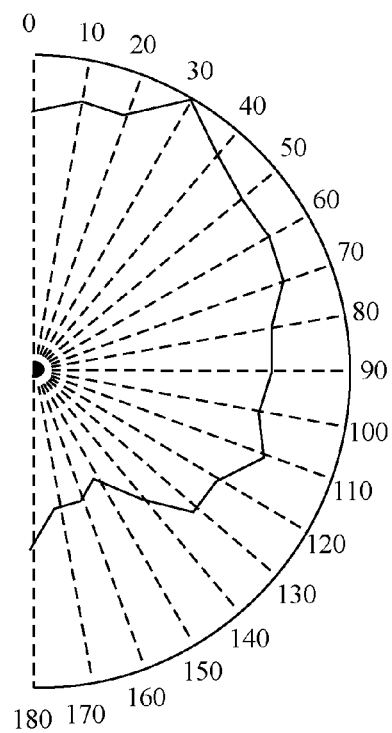
Fig. 26A        Fig. 26B

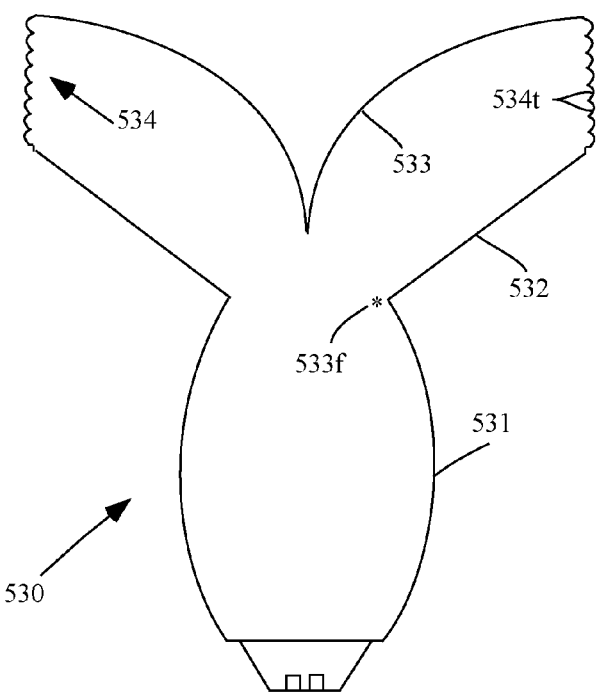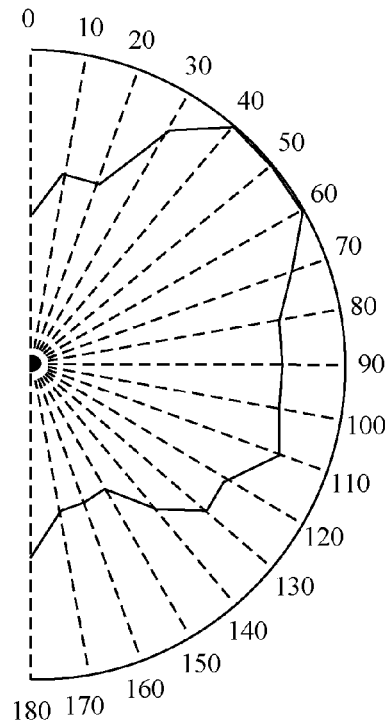
Fig. 27A  Fig. 27B
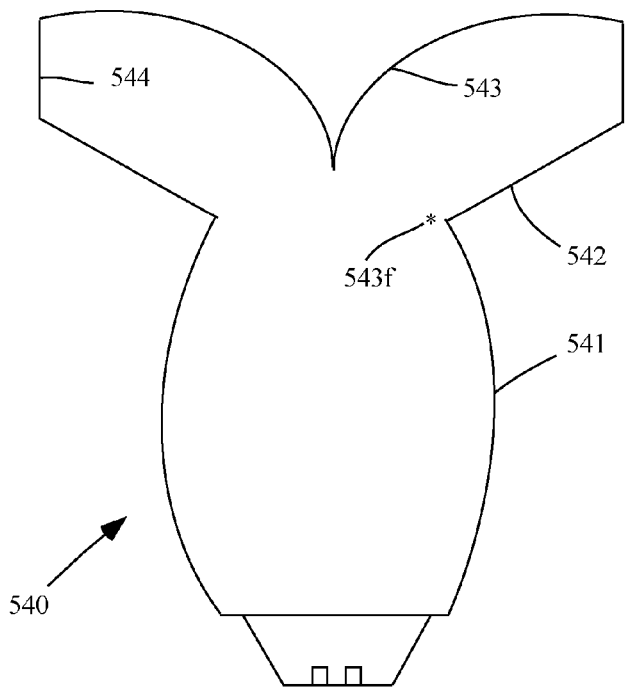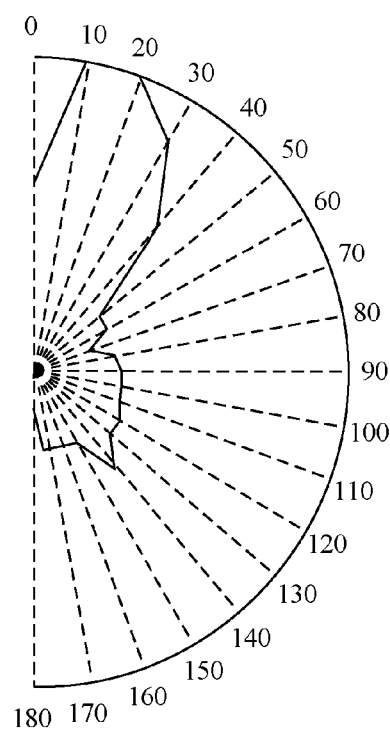
Fig. 28A  Fig. 28B

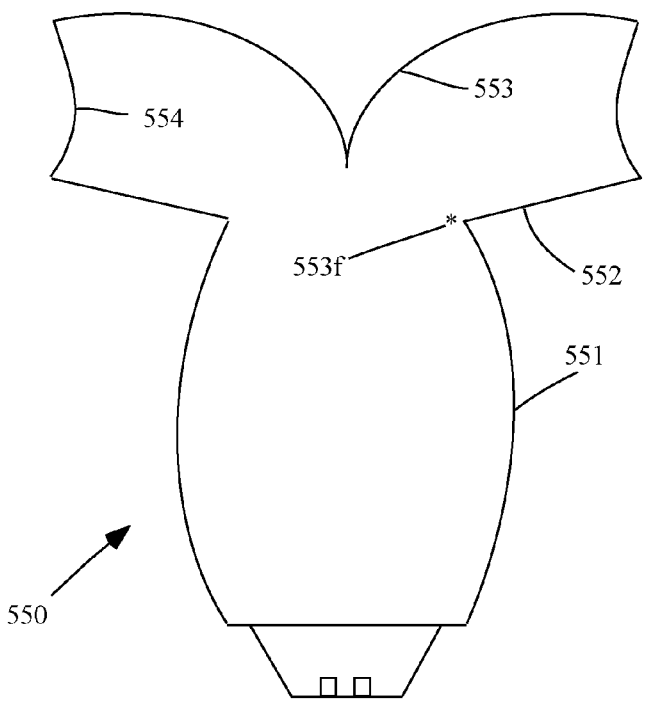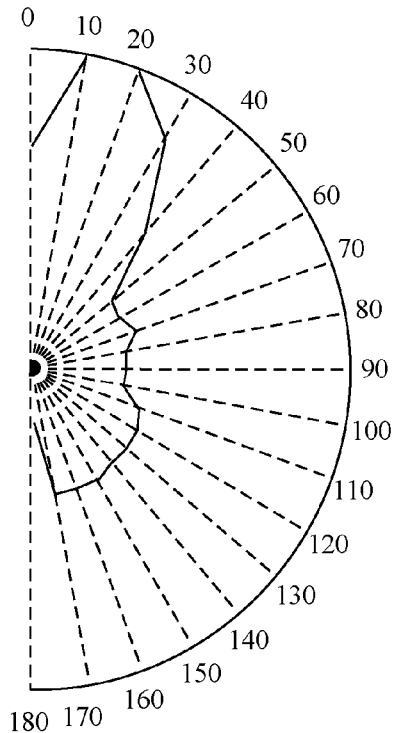
Fig. 29A  Fig. 29B
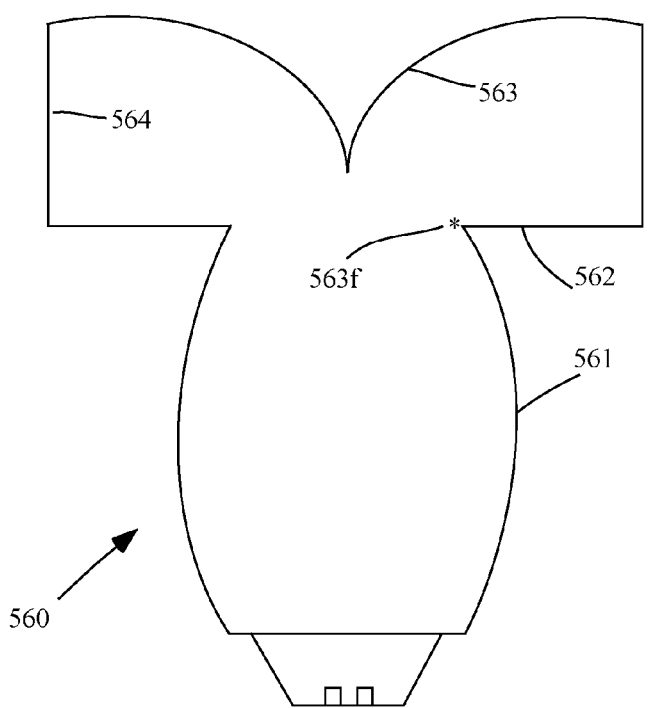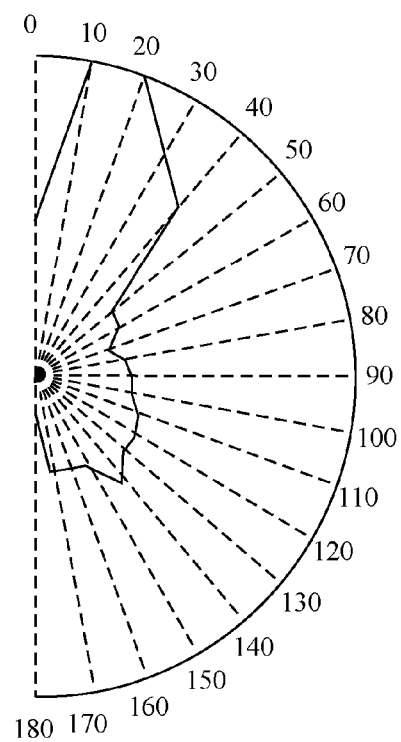
Fig. 30A  Fig. 30B

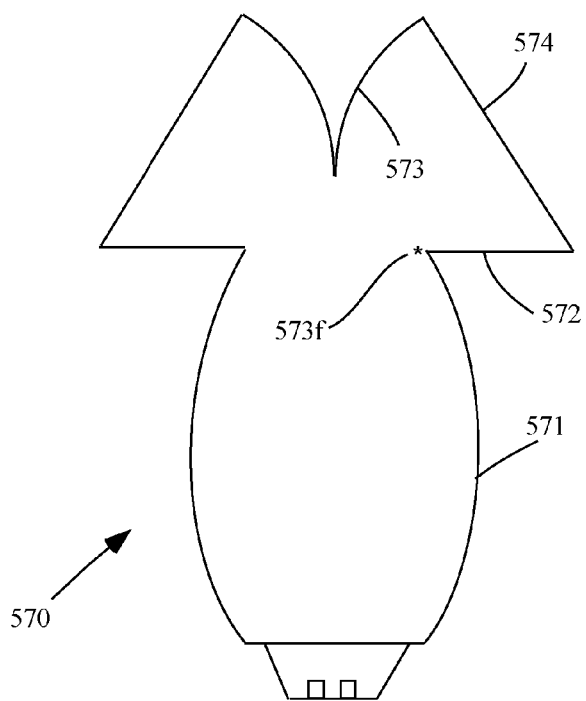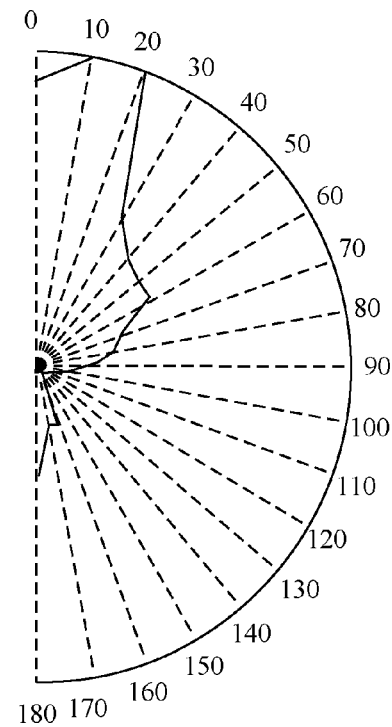
Fig. 31A  Fig. 31B
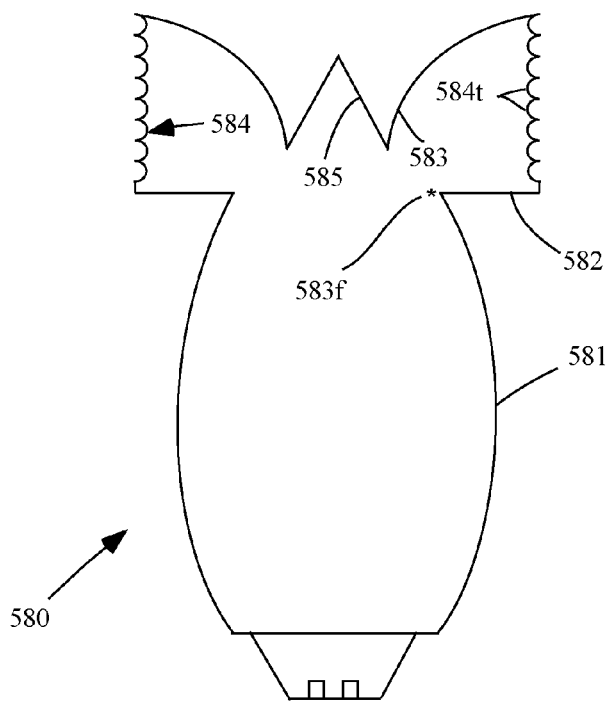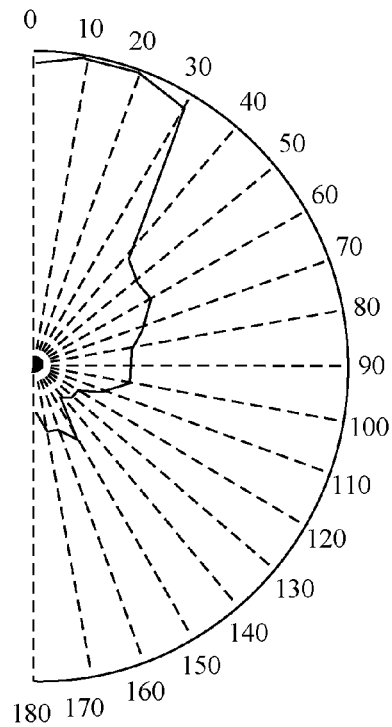
Fig. 32A  Fig. 32B

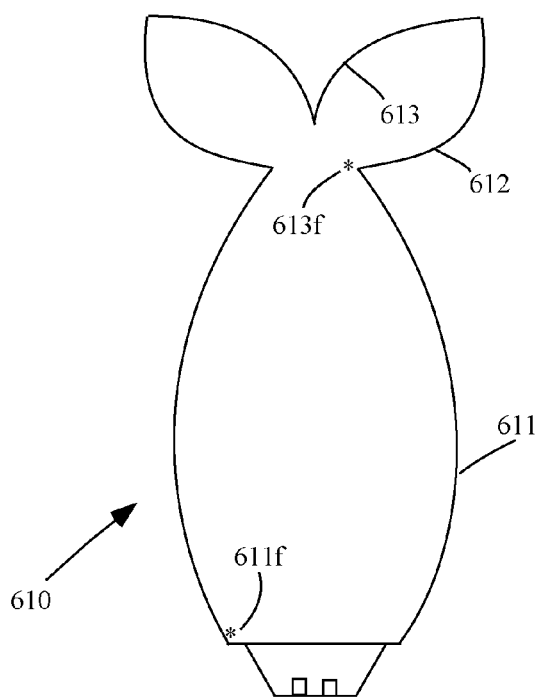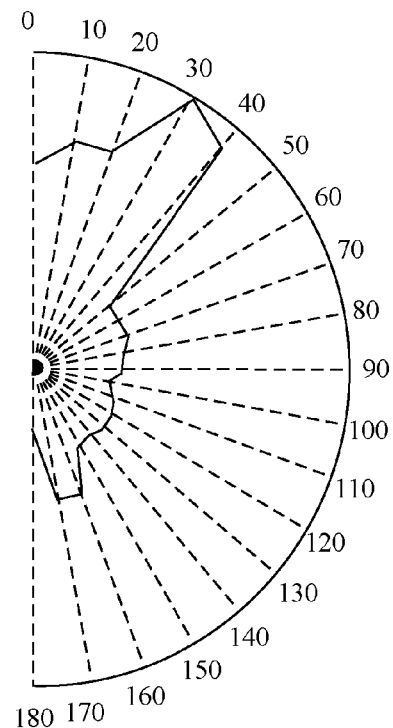
Fig. 35A  Fig. 35B
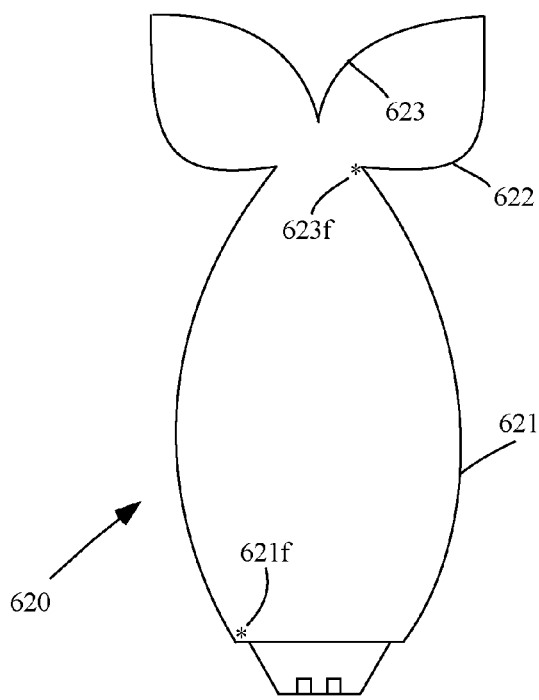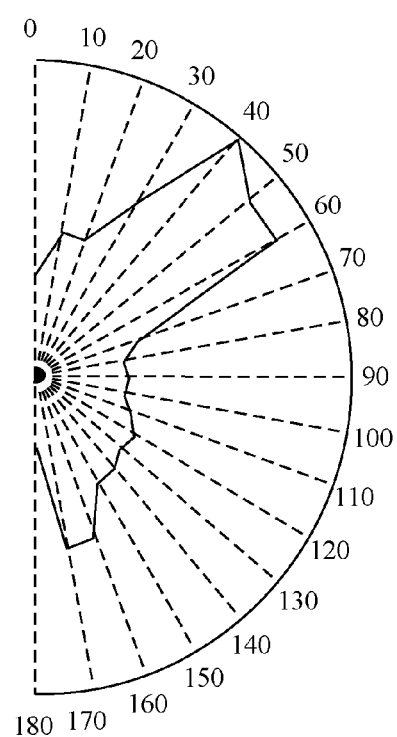
Fig. 36A  Fig. 36B

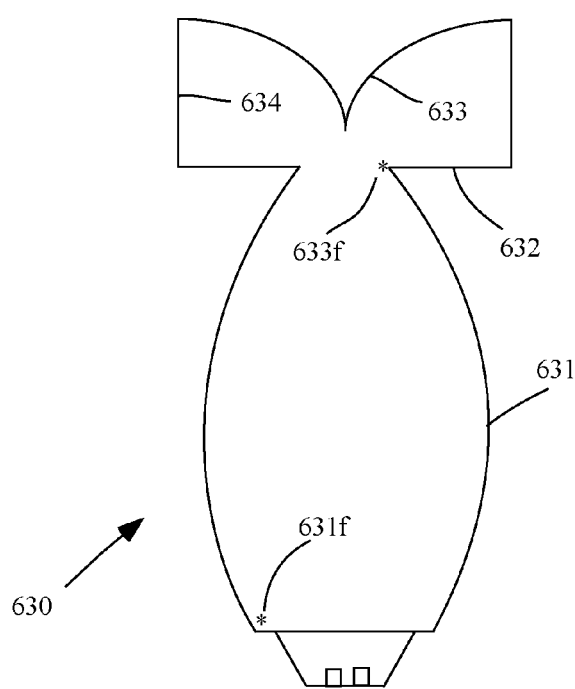 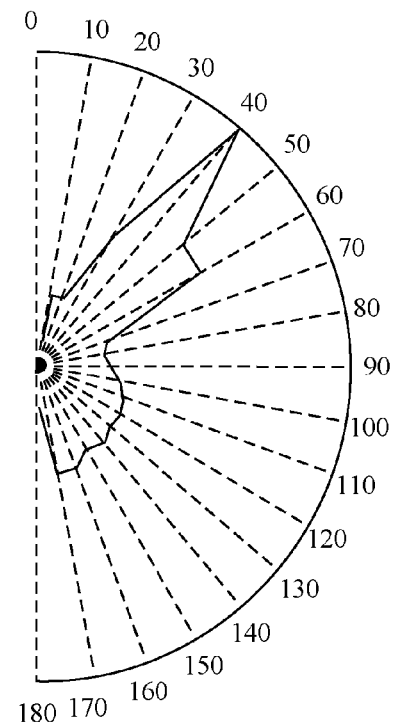
Fig. 37A  Fig. 37B
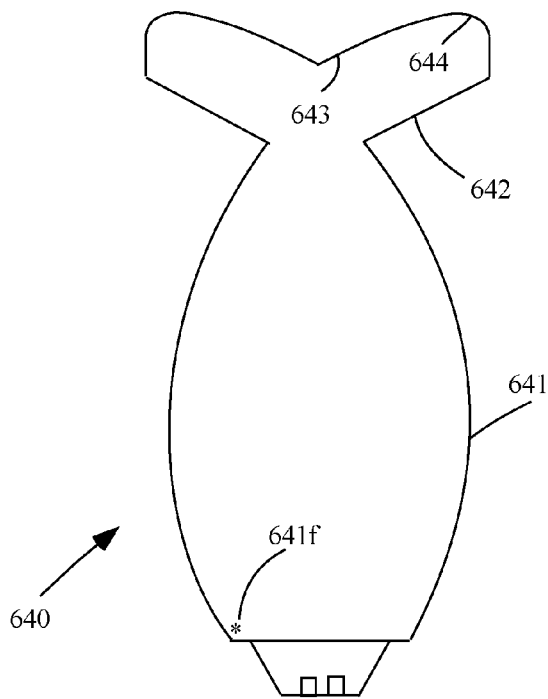 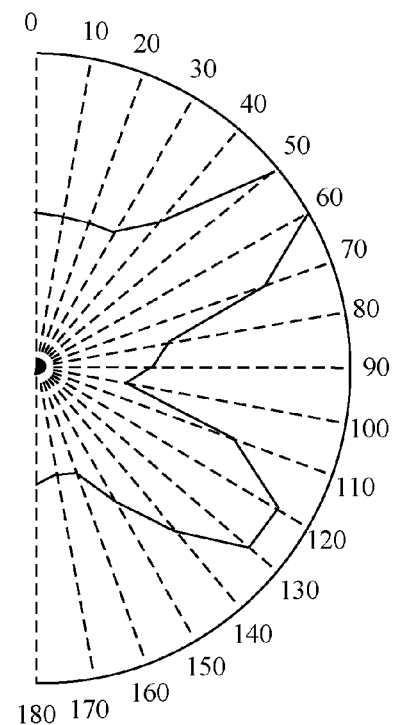
Fig. 38A  Fig. 38B

OPTICAL DEVICE FOR LED-BASED LAMP

This application is a divisional application of U.S. patent application Ser. No. 10/816,228, now U.S. Pat. No. 7,329,029, filed Mar. 31, 2004, to Chaves et al., entitled OPTICAL DEVICE FOR LED BASED LAMP, which is a continuation-in-part of:

U.S. patent application Ser. No. 10/814,598 now abandoned, filed Mar. 30, 2004, to Chaves et al., entitled OPTICAL DEVICE FOR LED-BASED LAMP, which claims the benefit under 35 U.S.C. §119(e) of both provisional Application No. 60/470,691, filed May 13, 2003, to Miñano, entitled OPTICAL DEVICE FOR LED-BASED LIGHT-BULB SUBSTITUTE, and provisional Application No. 60/520,951, filed Nov. 17, 2003, to Falicoff et al., entitled COLOR-MIXING COLLIMATOR, each of provisional Application Nos. 60/470,691 and 60/520,951 are incorporated herein by reference in their entirety; and U.S. patent application Ser. No. 10/461,557, now U.S. Pat. No. 7,021,797, filed Jun. 12, 2003, to Miñano, et al., entitled OPTICAL DEVICE FOR LED-BASED LIGHT-BULB SUBSTITUTE, which claims the benefit under 35 U.S.C. §119(e) of provisional Application No. 60/470,691, filed May 13, 2003, to Miñano, entitled OPTICAL DEVICE FOR LED-BASED LIGHT-BULB SUBSTITUTE, each of U.S. patent application Ser. Nos. 10/816,228, now U.S. Pat. No. 7,329,029 and 10/461,557, and provisional Application No. 60/470,691 are incorporated herein by reference in their entirety.

The present embodiments may be further understood and/or can also be utilized with the embodiments described in U.S. patent application Ser. No. 10/461,557, now U.S. Pat. No. 7,021,797, filed Jun. 12, 2003, to Miñano et al., entitled OPTICAL DEVICE FOR LED-BASED LIGHT-BULB SUBSTITUTE, which is incorporated herein by reference in its entirety.

BACKGROUND OF THE INVENTION

The present invention relates to light-emitting diodes (LEDs), particularly optical means for producing various far-field light intensity distributions for LEDs.

Conventional incandescent lamps of less than 100 lumens output can be matched by the latest white LEDs, albeit at a higher price. At this low end of the lumen range, the majority of incandescent applications are battery-powered. It is desirable to have an LED suitable for direct installation in the place of a burnt-out flashlight bulb.

LED's can offer superior luminous efficacy over the conventional incandescent lamps used in battery-operated flashlights. Moreover, LEDs are far more tolerant of shock, vibration, and crush-stress. Although they currently cost more to produce than the incandescents, their lifetimes are ten thousand times longer. For the sake of efficacy flashlight bulbs are run hot so they typically last only a few hours until filament failure. Also, the prices of LEDs continue to fall, along with those of the control-electronics to handle variations in battery voltage.

Indeed, LED flashlights are commercially available already, but their optics have to be adapted to the geometry of light-emitting diodes, which only emit into a hemisphere. Conventional LED lamps are unsuitable for direct installation into conventional flashlights, both electrically and optically. LED lamps are electrically unsuitable because they are current-driven devices, whereas batteries are voltage sources. Typical variations in the voltage of fresh batteries are enough to exceed an LED's tolerable operating-voltage range. This causes such high currents that the Ohmic heating within the die exceeds the ability of thermal conduction to remove it, causing a runaway temperature-rise that destroys the die. Therefore, a current-control device must accompany the lamp.

Conventional LED lamps are optically unsuitable for direct installation into the parabolic reflectors of flashlights. This is because their bullet-lens configuration forms a narrow beam that would completely miss a nearby parabola. Using instead a hemispherically emitting non-directional dome, centered on the luminous die, gives the maximum spread commercially available, a Lambertian pattern, with a $\sin^2\theta$ dependence of encircled flux on angle $\theta$ from the lamp axis. Since $\theta$ for a typical parabolic flashlight reflector extends from 45° to 135°, an LED with a hemispheric pattern is mismatched because it's emission falls to zero at only $\theta=90°$. This would result in a beam that was brightest on the outside and completely dark halfway in. Worse yet, even this inferior beam pattern from a hemispheric LED would require that it be held up at the parabola's focal point, several millimeters above the socket wherein a conventional incandescent bulb is installed.

Another type of battery-powered lamp utilizes cylindrical fluorescent lamps. Although LEDs do not yet offer better luminous efficacy, fluorescent lamps nonetheless are relatively fragile and require unsafely high voltages. A low-voltage, cylindrical LED-based lamp could advantageously provide the same luminous output as a fluorescent lamp.

Addressing the needs above, U.S. patent application Ser. No. 10/461,557, OPTICAL DEVICE FOR LED-BASED LIGHT-BULB SUBSTITUTE, filed Jun. 12, 2003, which is hereby incorporated by reference in its entirety, discloses such LED-based lamps with which current fluorescent and incandescent bulb flashlights can be retrofitted. It often desirable, however, for LED lamps such as those described in U.S. patent application Ser. No. 10/461,557 to have other far-field intensity distributions of interest. Also, U.S. patent application Ser. No. 10/461,557 touched on the function of color mixing, to make the different wavelengths of chips 23, 24, and 25 of FIG. 2 of U.S. patent application Ser. No. 10/461,557 have the same relative strengths throughout the light coming out of ejector section 12. This assures that viewers will see only the intended metameric hue and not any colors of the individual chips. Previously, rectangular mixing rods have been used to transform the round focal spot of an ellipsoidal lamp into a uniformly illuminated rectangle, typically in cinema projectors. Generally, polygonal mixing rods worked best with an even number of sides, particularly four and six. With color mixing for LEDs, however, such rods are inefficient because half of an LED's Lambertian emission will escape from the base of the rod.

There is thus a need in the art for effective and optically suitable LED lamps with various far-field intensity distributions and have proper shaping of their transfer sections enabling polygonal cross-sections to be used.

SUMMARY OF THE INVENTION

The present invention advantageously addresses the needs above as well as other needs by providing an optical device for LED-based lamps with configurations for various far-field intensity distributions.

In some embodiments, an optical device for use in distributing radiant emission of a light emitter is provided. The optical device can comprise a lower transfer section, and an upper ejector section situated upon the lower transfer section. The lower transfer section is operable for placement upon the light emitter and further operable to transfer the radiant emission to said upper ejector section. The upper ejector section can be shaped such that the emission is redistributed externally into a substantial solid angle. In some preferred embodiments, the transfer section is a solid of revolution having a profile in the shape of an equiangular spiral displaced laterally from an axis of said solid of revolution so as to place a center of the equiangular spiral on an opposite side of the axis therefrom.

In some embodiments, an optical device for distributing the radiant emission of a light emitter is provided. The optical device can comprise a lower transfer section, and an upper ejector section situated upon the lower transfer section. The lower transfer section can be operable for placement upon the light emitter and operable to transfer the radiant emission to the upper ejector section. The upper ejector section can be shaped such that the emission is redistributed externally into a substantial solid angle. The ejector section can further comprise lower and connecting upper portions.

Some preferred embodiments provide an optical device for distributing radiant emissions of a light emitter. The optical device can comprise a transfer section, and an ejector section situated upon the transfer section. The transfer section is operable for placement adjacent with a light emitter and operable to transfer radiant emission from the light emitter to the ejector section. The ejector section is shaped such that the emission is redistributed externally into a substantial solid angle. In some embodiments, the ejector section has an upper surface with a profile of an equiangular spiral with a center at an upper edge of said transfer section. Some embodiments further provide for the ejector section to include a surface comprised of a radial array of V-grooves. Still further embodiments provide that a surface of said transfer section is comprised of an array of V-grooves. Further, the transfer section can be a polygonal, can be faceted and/or have other configurations.

In one embodiment, the invention can be characterized as an optical device for distributing radiant emission of a light emitter comprising a lower transfer section and an upper ejector section situated upon the lower transfer section. The lower transfer section is operable for placement upon the light emitter and operable to transfer the radiant emission to the upper ejector section. The upper ejector section is shaped such that the light within it is redistributed out an external surface of the upper ejector section into a solid angle substantially greater than a hemisphere, and approximating that of an incandescent flashlight bulb. The ejector section is positioned at the same height as the glowing filament of the light bulb it replaces. It is easier to optically move this emission point, using the transfer section, than to put the LED itself at such a height, which would make heat transfer difficult, among other problems that the present invention advantageously addresses.

In another embodiment, this invention comprises a multiplicity of such transfer sections joined end-to-end, with two LED sources at opposite ends of this line-up. These transfer sections have slightly roughened surfaces to promote diffuse emission, so that the entire device acts as a cylindrical emitter, and approximating the luminous characteristics of a fluorescent flashlight bulb.

A better understanding of the features and advantages of the present invention will be obtained by reference to the following detailed description of the invention and accompanying drawings, which set forth an illustrative embodiment in which the principles of the invention are utilized.

BRIEF DESCRIPTION OF THE DRAWINGS

The above and other aspects, features and advantages of the present invention will be more apparent from the following more particular description thereof, presented in conjunction with the following drawings wherein:

FIGS. 1a through 38b are cross sectional views of LED lamps having various configurations of transfer and ejector lens sections (hereafter called virtual filaments) according to the present invention, with each cross sectional view accompanied, respectively, by the individual configuration's far field pattern.

FIG. 48c depicts a 300° emission pattern produced by the collar of FIG. 48a.

Corresponding reference characters indicate corresponding components throughout the several views of the drawings, especially the explicit label in FIG. 1a of LED package 20 being implied throughout FIG. 2a to FIG. 38a.

DETAILED DESCRIPTION OF THE PREFERRED EMBODIMENTS

Figure 23A:
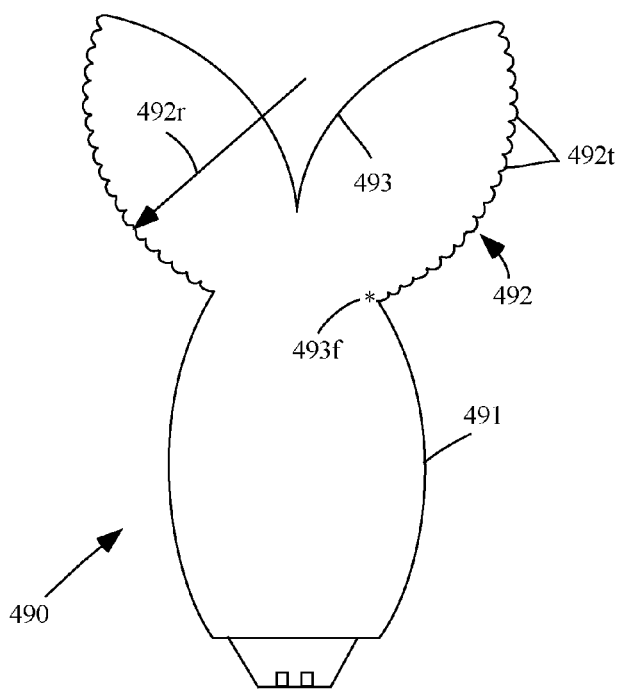

The following description of the presently contemplated best mode of practicing the invention is not to be taken in a limiting sense, but is made merely for the purpose of describing the general principles of the invention. The scope of the invention should be determined with reference to the claims.

The present embodiments provide light sources with pre-defined far-field intensities. The present embodiments can be utilized in numerous applications. For example, in some applications, the embodiments can be utilized to replace and/or substitute for other types of light sources, such as compact light sources, incandescent light sources, florescent light sources and other light sources. As a further example, the present embodiments can be utilized in replacing incandescent light sources in flight lights and other devices using incandescent light sources.

The present embodiments can also be utilized with the embodiments described in co-pending U.S. Provisional Patent application No. 60/520,951, filed Nov. 17, 2003, incorporated herein by reference in its entirety. The surface faceting configuration presented herein in FIG. 49A and FIG. 49B, and in co-pending U.S. Provisional Patent Application No. 60/520,951, filed Nov. 17, 2003, can be employed in variations of all of the non-faceted embodiments shown herein in order to achieve the color mixing and other benefits thereof.

The present embodiments can further be utilized with the embodiments of and in the applications described in U.S. Provisional Patent Application No. 60/470,691, filed May 13, 2003, and U.S. patent application Ser. No. 10/461,557, filed Jun. 12, 2003, incorporated herein by reference in their entirety. For example, the present embodiments can be utilized in the light sources described in U.S. Provisional Patent Application No. 60/470,691, filed May 13, 2003, and U.S. patent application Ser. No. 10/461,557, filed Jun. 12, 2003.

FIGS. 1a through 38b are cross sectional views of LED lamps having various configurations of transfer and ejector lens sections (hereafter called virtual filaments) according to some present embodiments, with each cross sectional view accompanied, respectively, by the individual configuration's far field pattern.

Only FIG. 1b has the labels that are implicit in all the output patterns of the preferred embodiments in the figures that follow: semicircular polar plot 2700 shows normalized far-field distribution 2701 on semi-circular angular scale 2702, with off-axis angle, with zero denoting the on-axis direction, and 180° the opposite direction, totally backward. This is possible for those preferred embodiments having some sideways extension so that 180° is unimpeded by the source.

In FIG. 1a only, the light source is designated as LED package 20 with LED chips 22, 23, and 24, but the same package-outline is depicted without labels in all subsequent figures of virtual filaments. This LED package represents but one possible way for the present invention to utilize multiple light emitters. Such multiple chips can have identical or different wavelengths. For example, the different wavelengths can be red, green, and blue wavelengths that span a chromaticity gamut for human color vision, or amber, red, and infra-red wavelengths for night-vision devices, or other combinations of different wavelengths.

Similarly in FIG. 1a only, the position of the focus of ellipse segment 271 is shown by star 271f. In all subsequent figures, the focus of the profile of the transfer section is also near the bottom point of the same curve on an opposite side of a central axis.

FIG. 1a shows virtual filament 270 comprising compound elliptical concentrator (hereinafter CEC) transfer section 271, and an ejector section comprising outward slanting lower cone 272 and inward slanting upper cone 273. FIG. 1b shows that the far-field distribution of this preferred embodiment peaks in the forward direction with a ±20° extent.

FIG. 2a shows virtual filament 280 comprising CEC transfer section 281, multiple stacked toroids 282, and ejector section 283, shaped as an equiangular spiral with origin at point 283f. FIG. 2b shows that the maximum far-field intensity of this preferred embodiment lies on angles from about 50° to 60° off-axis, a so-called bat-wing distribution.

FIG. 3a shows virtual filament 290, comprising CEC transfer section 291, cones 292 and 293, and equiangular spirals 294 and 295. Predominantly horizontal equiangular spiral 294 has its center at central point 294f. Equiangular spiral profile 295 has oppositely situated center 295f. FIG. 3b shows the far-field distribution of this preferred embodiment, peaking at 40° off-axis and mostly confined to the range of 10-70°, also with a secondary lobe from 150-170°.

FIG. 4a shows virtual filament 300 comprising CEC section 301, flat 302, sideways equiangular spiral 303 with center at point 303f, and top equiangular spiral 304 with center at point 304f. FIG. 4b shows a subtle tuning of the far-field resulting from the noticeable profile-modification, as shown in FIG. 4a, of the preferred embodiment shown in FIG. 3a. FIG. 4b shows that the far-field distribution of this preferred embodiment has a primary maximum on a main lobe between 40° and 60° off-axis, and a secondary maximum on a secondary rear lobe extending between 160° and 170°, nearly backwards. The next preferred embodiment is a modification of this one.

FIG. 5a shows virtual filament 310 with CEC transfer section 311, planar annulus 312, equiangular spiral 313 with center at axial point 313f, and upper equiangular spiral 314 with center at opposite point 314f. In addition to elements in correspondence with those of FIG. 4a are inward slanting steep cone 315, upward slanting shallow cone 316, and upper flat circle 317. The normalized far-field pattern of this preferred embodiment differs significantly from the previous, as shown in FIG. 5b, with a fluctuating forward lobe and a half-strength rear lobe.

Delving further on the theme of minor modifications, FIG. 6a shows virtual filament 320 comprising CEC transfer section 321, planar annulus 322, equiangular spiral 323 with axial position of its center as shown by star 323 f, upper equiangular spiral 324 with center at opposite point 324f, and a new element—central upper equiangular spiral 327, also with center at 324f. In similarity to FIG. 5a, virtual filament 320 also comprises inwardly slanting steep cone 325 and upward shallow cone 326. The normalized far-field pattern of the preferred embodiment of FIG. 6a is shown by FIG. 6b to be mainly between 30° and 50° off axis, with a rear lobe from 120° to 170°, with reduced forward emission as compared to FIG. 5b.

FIG. 7a depicts a preferred embodiment that is the result of small modifications of virtual filament 320 of FIG. 6a. FIG. 7a is a cross-section of virtual filament 330, comprising CEC transfer section 331, slanting conical section 332, horizontal equiangular spiral 333 with center at axial point 333f, steep conic edge 335, vertical equiangular spiral 334 with oppositely situated center 334f, and central cone 336. FIG. 7b shows its far-field intensity concentrated in a forward lobe within ±20° of the axis, with a strong rearward lobe peaking at 150°.

Continuing the theme of component modifications, FIG. 8a depicts virtual filament 340 comprising CEC transfer section 341, planar annulus 342, inwardly slanting steep cone 335, downward slanting shallow cone 346, outer edge 348, horizontal equiangular spiral 343 with center at off-axis point 343f, vertical equiangular spiral 344 with center at opposite point 344f, and upper equiangular spiral 347, also with center at opposite point 344f. FIG. 8b shows that its far field pattern has a collimated anti-axial beam and a broader ±30° forward beam.

FIG. 9a depicts virtual filament 350 comprising CEC transfer section 351, dual conical flanges 352, and upper conic indentation 353. FIG. 9b shows that its far-field pattern has strong forward and rear lobs, but some side emission.

FIG. 10a depicts virtual filament 360 comprising CEC transfer section 361, conical flange 362, upper equiangular spiral indentation 363 with center at proximal point 363f, and cylindrical flange 364. FIG. 10b shows how the rearward emission of FIG. 9b has been eliminated.

FIG. 11a depicts another variation of FIG. 10a. Virtual filament 370 comprises CEC transfer section 371, dual conic flanges 372, central conic indentation 373, set into central cylinder 374. The far field pattern of FIG. 11b shows a forward ±30° main lobe and a small secondary lobe at 125°.

FIG. 12a depicts a variation of component proportions in the preferred embodiment of FIG. 11a. Virtual filament 380 comprises CEC transfer section 381, dual conic flanges 382, and central conic indentation 383. The far field intensity pattern of FIG. 12b shows the same overall forward and backward emphasis of FIG. 9b, with differing details.

FIG. 13a depicts virtual filament 390 comprising CEC transfer section 391, spheric section 392, and central conic indentation 393. In similarity to spheric ejector section 72 of FIG. 7 of U.S. patent application Ser. No. 10/461,557, both surfaces 392 and 393 are diffusing, in that rays from within and going through them are scattered diffusely into air. FIG. 13b shows a strong forward lobe of ±40° superimposed on a weaker emission that is nearly omnidirectional.

FIG. 14a depicts virtual filament 400 comprising CEC transfer section 401, steeply slanting cone 402, outer equiangular spiral 403 with axially located center 403f, and inner equiangular spiral 404 with center at proximal point 404f. As shown in FIG. 14b, its far field intensity pattern has no rearward energy, and somewhat approximates a Lambertian pattern.

In a variant of the previous figure, FIG. 15a depicts virtual filament 410 comprising CEC transfer section 411, cylindrical stack 412 of multiple toroidal sections 412t, inner equiangular spiral 414 with center at proximal point 414f, and upper curve 413 tailored to refract rays coming from 414f and being reflected at 414 and direct them tangent to 413. FIG. 15b shows the resultant far-field pattern to be mostly forward, within ±30°.

FIG. 16a depicts virtual filament 420, comprising CEC transfer section 421, cylinder 422, conical indentation 423 in shallower top cone 424. FIG. 16b shows its far-field pattern is mostly between 10° and 20° off axis.

FIG. 17a depicts virtual filament 430, comprising CEC transfer section 431, outer cone 432, and inner conical indentation 433. In spite of the small differences from FIG. 16a, the far-field pattern of FIG. 17b is considerably different from that of FIG. 16b.

FIG. 18a depicts virtual filament 440, comprising CEC transfer section 441, outer cone 442, and inner conical indentation 443. In spite of the small differences of this preferred embodiment from that of from FIG. 17a, the far-field pattern of FIG. 18b is narrower than that of FIG. 17b.

FIG. 19a depicts virtual filament 450 comprising CEC transfer section 451, spline curve 452, central equiangular spiral 453 with center at proximal point 453f, and surrounding top conic indentation 454. FIG. 19b shows its far-field pattern is predominantly forward, with ±20° at the half-power point.

FIG. 20a depicts virtual filament 460 comprising CEC transfer section 461, spheric section 462 with radius 462r that equals 0.38 times the height of section 461, and central equiangular spiral 463 with center at proximal point 463f. FIG. 20b shows its far-field pattern to lie between 10° and 60° off axis.

FIG. 21a depicts another similar configuration, virtual filament 470 comprising CEC transfer section 471, spheric section 472 with radius 472r that is 0.7 times the height of section 471, and central equiangular spiral 473 with center at proximal point 473f. FIG. 21b shows that the far-field pattern has significantly narrowed from the previous one.

FIG. 22a depicts another similar configuration, virtual filament 480 comprising CEC transfer section 481, spheric section 482 with radius 482r that is 0.8 times the height of section 481, and central equiangular spiral 483 with center at proximal point 483f. Spheric section 482 is partially covered with multiple convex toroidal lenslets 482t. FIG. 22b shows that the far-field pattern undergoes only minor change from the previous one, with narrowing of the central beam compared to that seen in FIG. 21b.

Figure 23B:
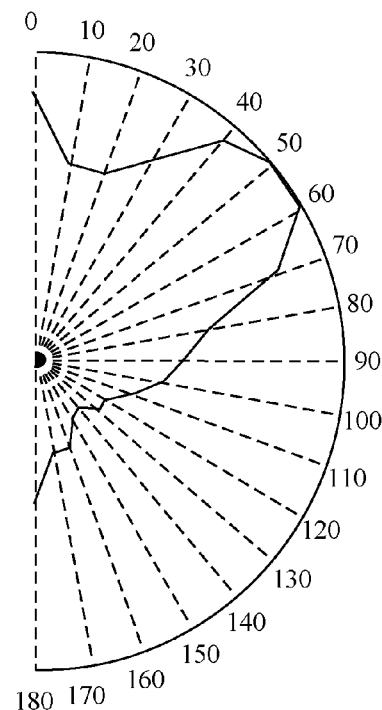

FIG. 23a depicts virtual filament 490 comprising CEC transfer section 491, spheric section 492 with radius 492r that is 0.62 times the height of section 491, section 492 being fully surfaced by multiple toroidal lenslets 492t, and central equiangular spiral 493 with center at proximal point 493f. FIG. 23b shows how these lenslets greatly broaden the far-field pattern over that of FIG. 22b.

Figure 24A:
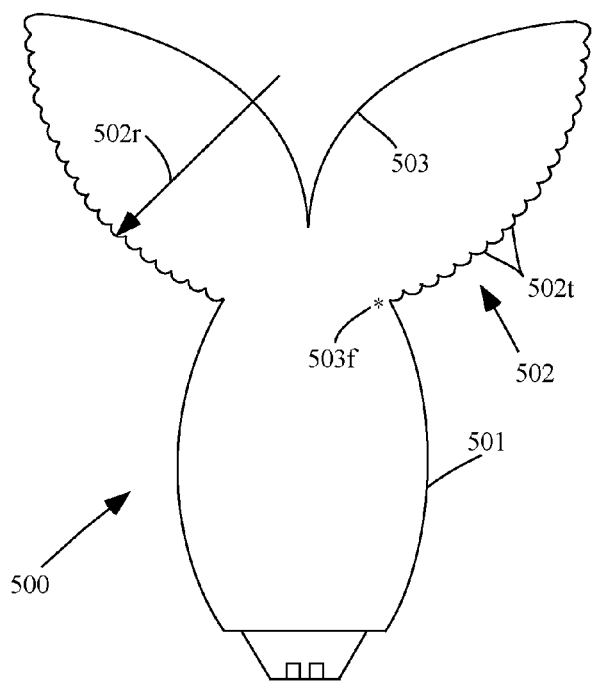
Figure 24B:
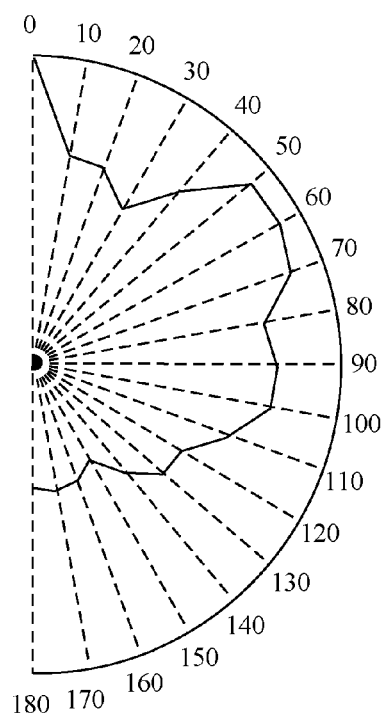

FIG. 24a depicts virtual filament 500 comprising CEC transfer section 501, spheric section 502 with radius 502r that is 0.76 times the height of section 501, section 502 being surfaced by multiple convex toroidal lenslets 502t, and central equiangular spiral 503 with center at proximal point 503f. FIG. 24b shows that the far field pattern is not greatly changed from that of FIG. 23b, by section 502 having a somewhat larger radius than that of section 492 of FIG. 23a.

FIG. 25a depicts virtual filament 510 comprising CEC transfer section 511, spheric section 512 with radius 512r that is equal to the height of section 511, section 512 surfaced by multiple convex toroidal lenslets 512t, and central equiangular spiral 513 with center at proximal point 513f. FIG. 25b shows that the far field pattern is now considerably changed from that of FIG. 24b, due to the larger radius of section 512 than that of section 502 of FIG. 24a.

FIG. 26a depicts virtual filament 520 comprising CEC transfer section 521, lower spline section 522, central equiangular spiral 523 with center at proximal point 523f, and outer cylindrical section 524 covered with multiple convex toroidal lenslets 524t. FIG. 26b shows a very broad pattern that does not vary much until 130° and is only reduced by half at 180°.

FIG. 27a depicts virtual filament 530 comprising CEC transfer section 531, conical section 532, central equiangular spiral 533 with center at proximal point 533f, and cylindrical stack 534 surfaced by multiple convex toroidal lenslets 534t. FIG. 27b shows that this substitution of a cone for a tailored spline causes the far-field pattern to drop in the near-axis angles, as compared to FIG. 26b. In the following FIGURE there are no such lenslets.

FIG. 28a depicts virtual filament 540 comprising CEC transfer section 541, conic section 542, central equiangular spiral 543 with center at proximal point 543f, and outer cylinder 544. FIG. 28b shows that the far-field pattern of this preferred embodiment is much narrower without the lenslets 534t of FIG. 27a.

FIG. 29a depicts virtual filament 550 comprising CEC transfer section 551, shallow upward cone 552, central equiangular spiral 553 with center at proximal point 553f, and outer concave spline 554. FIG. 29b shows its far-field pattern, with substantial axial emission.

FIG. 30a depicts virtual filament 560 comprising CEC transfer section 561, planar annulus 562, central equiangular spiral 563 with center at proximal point 563f, and outer cylinder 564. FIG. 30b shows its far-field pattern FIG. 31a depicts virtual filament 570 comprising CEC transfer section 571, planar annulus 572, central equiangular spiral 573 with center at proximal point 573f, and outer conical edge 574. FIG. 31b shows that far-field emission is predominantly forward.

FIG. 32a depicts virtual filament 580 comprising CEC transfer section 581, planar annulus 582, upper equiangular spiral 583 with center at proximal point 583f, outer cylinder 584 surfaced with concave toroidal lenslets 584t, and central upper cone 585. FIG. 32b shows that its far-field pattern is predominantly forward, with full intensity within ±30°.

Figure 33A:
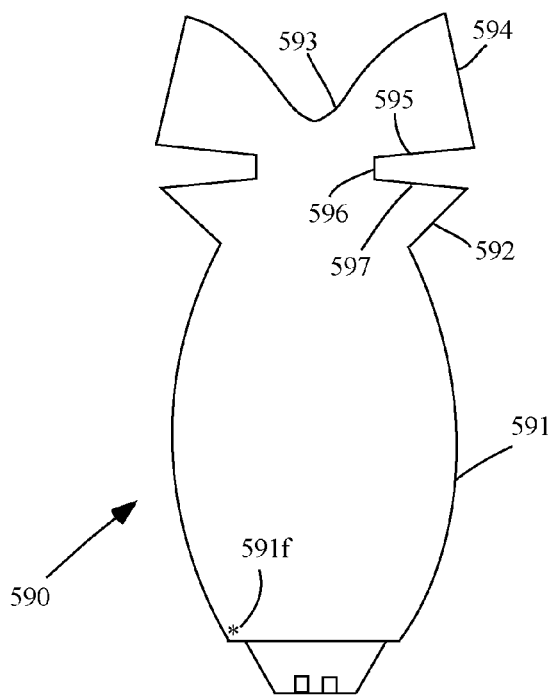
Figure 33B:
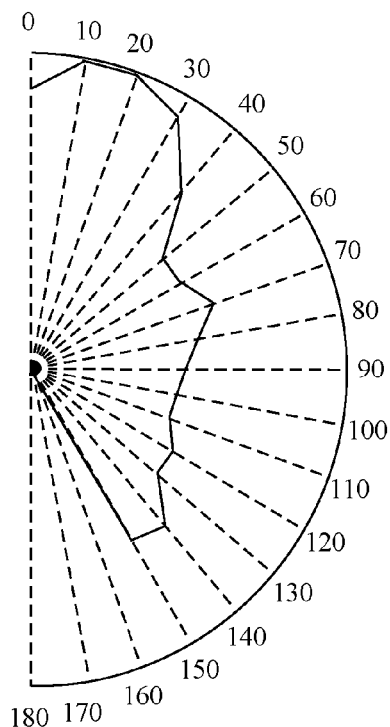

FIG. 33a depicts virtual filament 590 comprising equiangular-spiral transfer section 591 with center at opposite point 591f, outward cone 592, central indentation 593 shaped as a higher-order polynomial, and steep outer cone 594, and surfaces 595, 596, and 597 forming a slot. Its far-field pattern is shown in FIG. 33b, with a sharp cutoff at 150° off-axis and only 2:1 variation from uniform intensity at lesser angles.

Figure 34A:
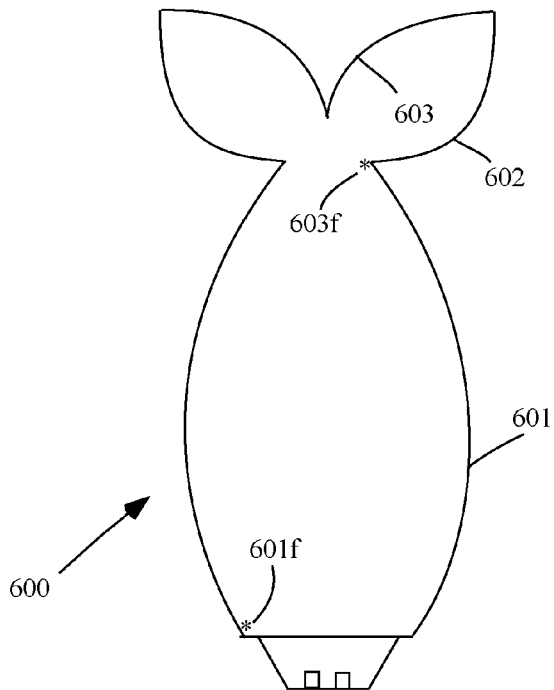
Figure 34B:
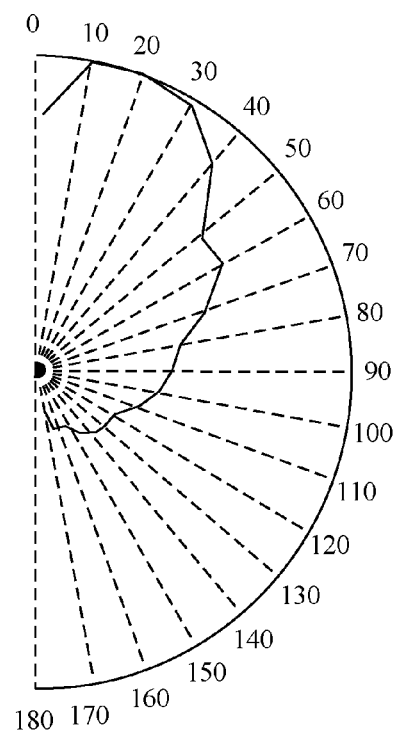

FIG. 34a depicts virtual filament 600 comprising equiangular-spiral transfer section 601 with center on opposite point 601f, protruding cubic spline 602, and central equiangular spiral 603 with center at proximal point 603f. Its far field pattern is shown in FIG. 34b, and is to be compared with those of the following two preferred embodiments, in which the cubic spline protrudes more.

FIG. 35a depicts virtual filament 610 comprising equiangular-spiral transfer section 611 with center at opposite point 611f, protruding cubic spline 612, and central equiangular spiral 613 with center at proximal point 613f. FIG. 35b shows that its far field pattern has reduced on-axis intensity compared with FIG. 34b.

FIG. 36a depicts virtual filament 620 comprising equiangular-spiral transfer section 621 with center at opposite point 621f, protruding cubic spline 622, and central equiangular spiral 623 with center at proximal point 623f. FIG. 36b shows that its far field pattern has reduced on-axis intensity compared with FIG. 35b.

FIG. 37a depicts virtual filament 630 comprising equiangular-spiral transfer section 631 with center at opposite point 631f, planar annulus 632, central equiangular spiral 633 with center at proximal point 633f, and outer cylinder 634. FIG. 37b shows that its far field pattern has no on-axis intensity. FIG. 37b can be compared with FIG. 30b, given the similarity of FIG. 37a to FIG. 30a.

FIG. 38a depicts virtual filament 640 comprising equiangular-spiral transfer section 641 with center at opposite point 641f, lower conical section 642, upper conical section 643, and outer spline curve 644. FIG. 38b shows the far-field pattern. Cone 642 is a white diffuse reflector with Lambertian scattering, so that unlike the diffuse transmissive surface 392 of FIG. 13a, it only reflects light falling on it.

Previous embodiments have complete circular symmetry, since they are formed by a 360° cylindrical profile-sweep. Thus they have no azimuthal shape variation, only the radial variation of the profile. This is because real-world 360° output patterns do not call for azimuthal variation. There is one type of azimuthal shape variation, however, having no azimuthal intensity variations in its light output. This is the V-groove.

Figure 39:
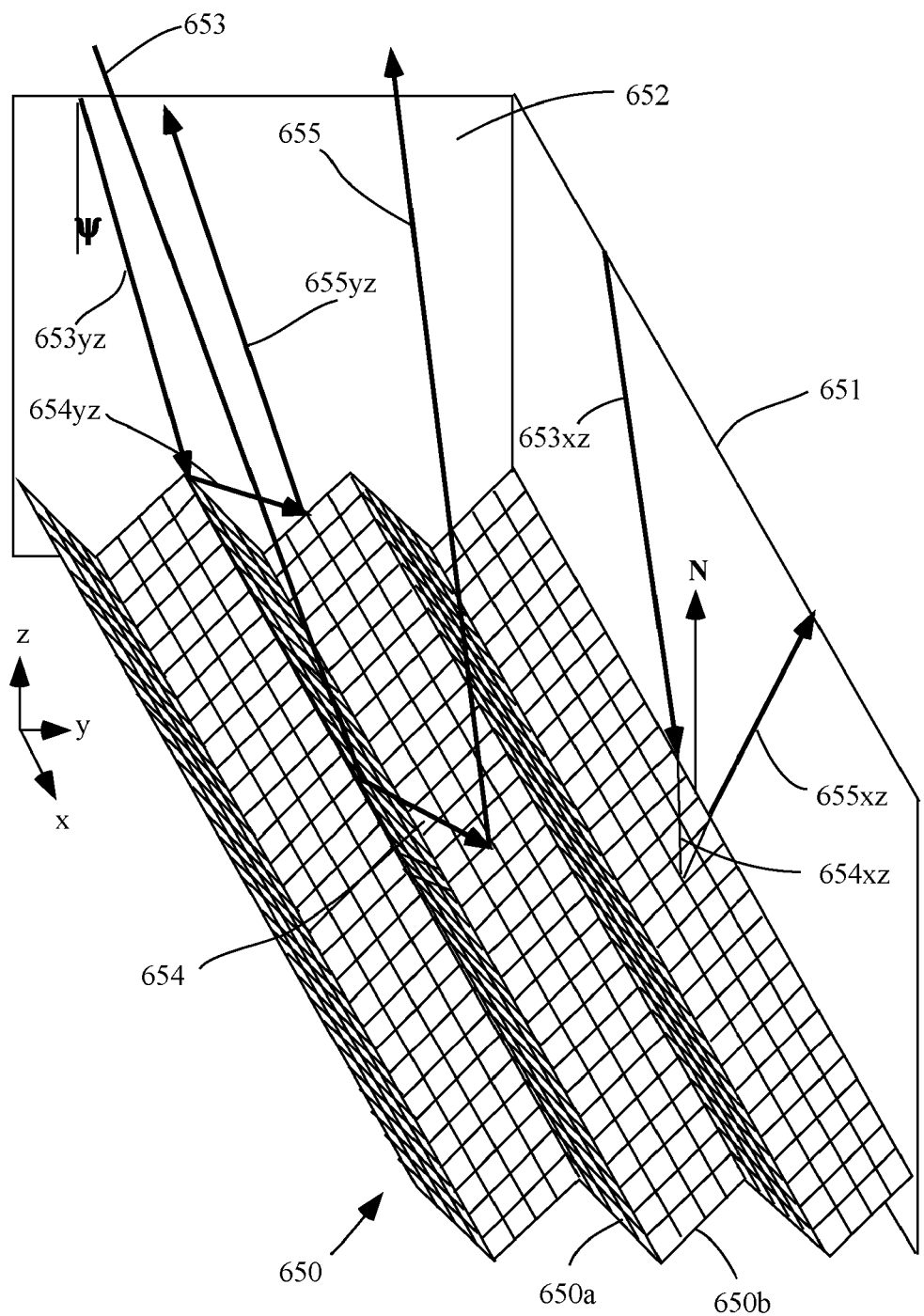
FIG. 39 is a perspective view of a linear array of V-grooves.

The geometry of a linear array of V-grooves is shown in FIG. 39. Reflective 90° V-groove array 650 is bordered by x-z plane 651 and y-z plane 652. Incoming ray 653 is reflected at first groove wall 650a become bounce ray 654, then reflected at second groove wall 650b to become outgoing ray 655. Incoming ray 653 has projection 653yz on border plane 652 and projection 653xz on border plane 651. Bounce ray 654 has projection 654yz on border plane 652 and projection 654xz on border plane 651. Outgoing ray 655 has projection 655yz on border plane 652 and projection 655xz on border plane 651.

FIG. 39 also shows macrosurface normal N lying perpendicular to the plane of V-groove array 650, which in the case of FIG. 39 is the xy plane. The directions of projected rays 653xz and 655xz obey the law of reflection from a planar mirror with the same surface normal. But on yz plane 652, outgoing projection 655yz has the opposite direction of incoming projection 653yz, which has in-plane incidence angle $\Psi$. Thus linear V-groove array 650 acts as a combination of retroreflector and conventional reflector. That is, when incoming ray 653 has direction vector (p, q, r), then outgoing ray 655 has direction vector (p, −q, −r). This condition, however, only holds for those rays undergoing two reflections. Of all possible input-ray directions, the fraction that is reflected twice is 1−tan($\Psi$).

The configuration pertinent to the present invention is when surface 650 is the interface between a transparent dielectric, such as acrylic or polycarbonate, lying above the surface (i.e. positive z) and air below it. The particular case shown in FIG. 39 is also valid for total internal reflection, which occurs whenever the incidence angle θ of a ray on the dielectric-air interface exceeds the local critical angle $\theta_c = \arcsin(1/n)$ for refractive index n.

Since the unitary normal vectors on the 2 sides of the grooves are $(0, \sqrt{0.5}, \sqrt{0.5})$ and $(0, -\sqrt{0.5}, \sqrt{0.5})$, the condition for total internal reflection can be vectorially expressed as $(p,q,r) \cdot (0, \pm\sqrt{0.5}, \sqrt{0.5}) < \cos \theta_c$ which can be rearranged to yield $|q| + \sqrt{(1-p^2-q^2)} < \sqrt{[2(1-1/n^2)]}$.

Figure 40:
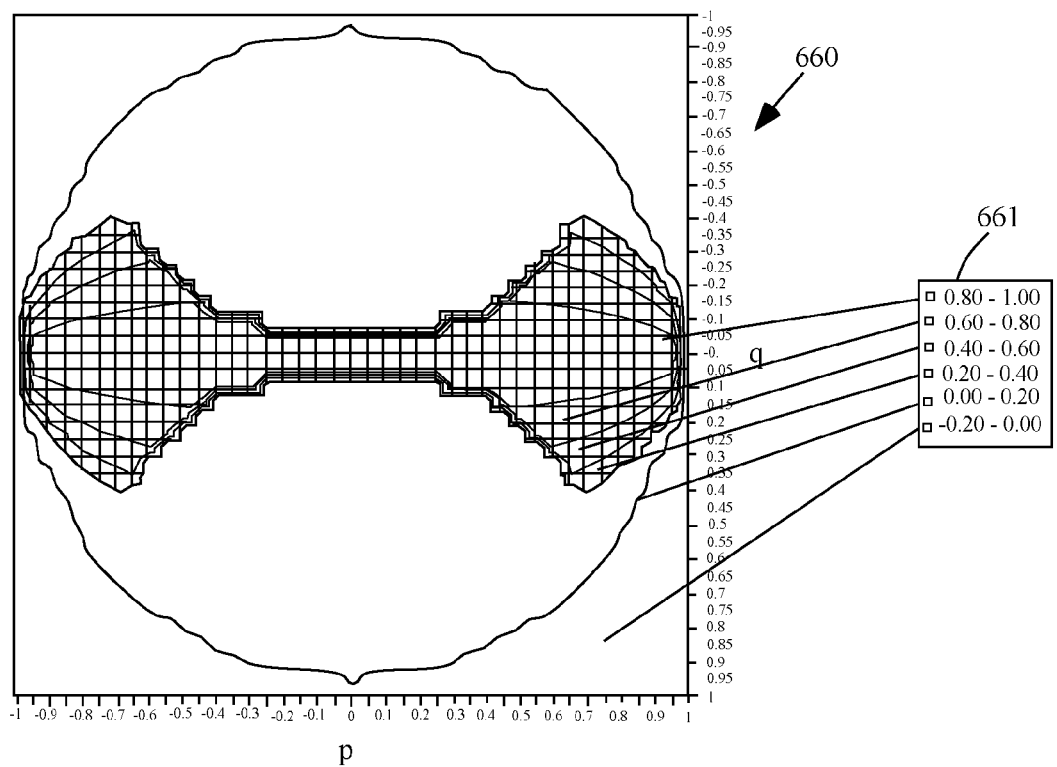
FIG. 40 is a diagram of the angles reflected by a linear V-groove array.

FIG. 40 shows contour graph 660 with abscissa p and ordinate q. Legend 661 shows the fraction of rays that are retroreflected by total internal reflection. For p=0, the maximum q value for which there is total internal reflection for the 2 reflections is $|\cos^{-1} q| < 45° - \theta_c$ which amounts to a vertical width of ±2.8° for acrylic (n=1.492) and ±6° for polycarbonate (n=1.585). These small angles are how much such incoming rays are not in plane 651.

Figure 41:
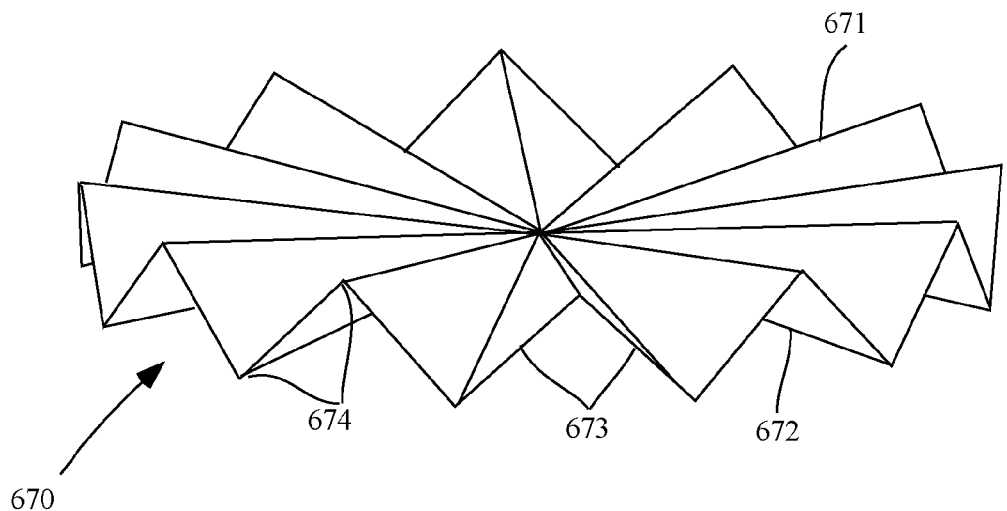
FIG. 41 is a perspective view of a radial array of V-grooves.

More pertinent to the present invention is radial V-groove array 670 shown in FIG. 41. Crest-lines 671 and trough-lines 672 are the boundaries of planar triangles 673, which meet at the crest-lines and trough-lines with 90° included angles 674.

In FIG. 37a, the genatrix curve of upper surface 633 has the form of an equiangular spiral. It is possible to impose a radial V-groove array on such a surface, so that crest-lines 671 of FIG. 41 would become curved downward, depressing the center point.

Figure 42A:
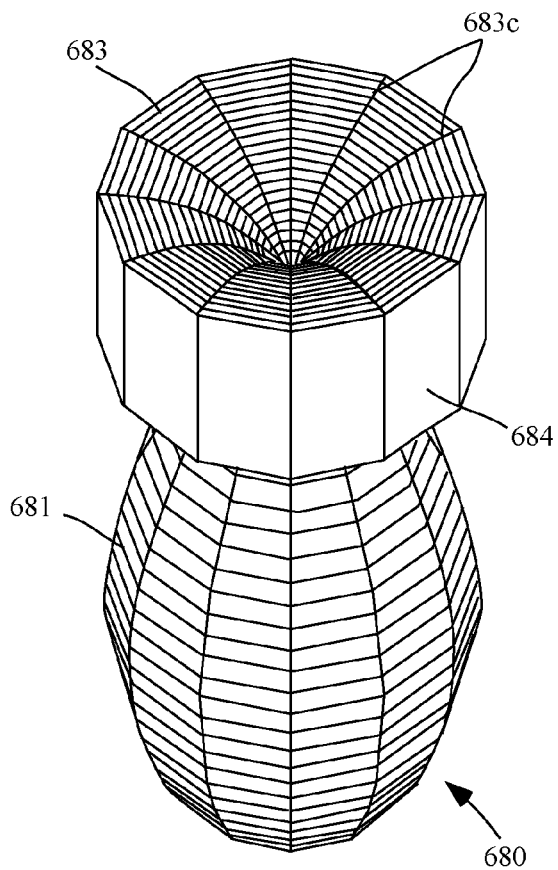
FIG. 42a is a perspective view of the configuration of FIG. 37a according to the present invention.

FIG. 42a is a perspective view of the preferred embodiment of FIG. 37a. Virtual filament 680 comprises equiangular-spiral transfer section 681, equiangular-spiral top surface 683, and cylindrical side surface 684, the apparently polygonal shape of which is a pictorial artifact. Crest curves 683c are shown as twelve in number, to correspond with crest-lines 671 of FIG. 41.

Figure 42B:
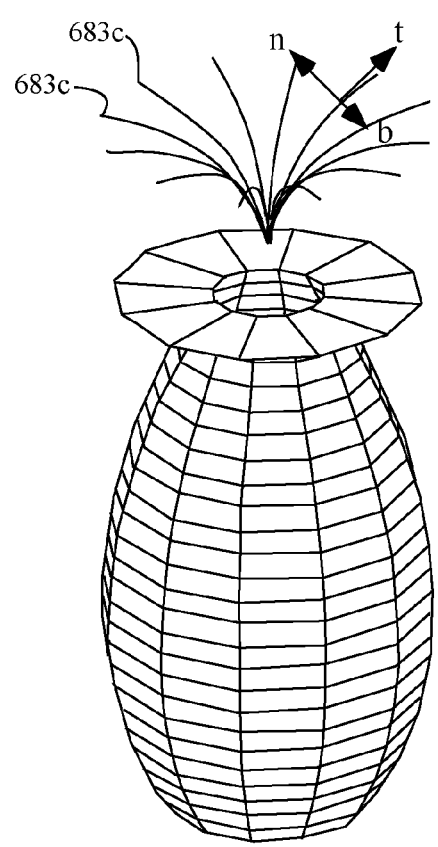
FIG. 42b is a perspective view showing the vector triad on the configuration of FIG. 42a according to the present invention.

FIG. 42b is another perspective view of the same preferred embodiment, but with surfaces 683 and 684 of FIG. 42a removed. Twelve crest-curves 683c are shown, one shown with tangent vector t, normal vector n, and their vector product the binormal vector b=t×n. If a crest-curve were the path followed at uniform speed by a particle, then its velocity vector lies along tangent vector t and its acceleration vector is the negative the normal vector n. The latter is so that it will coincide with the surface normal of the surface. Because each crest-curve lies in a plane, binormal vector b is constant, meaning the crest-curves have zero torsion.

Figure 43:
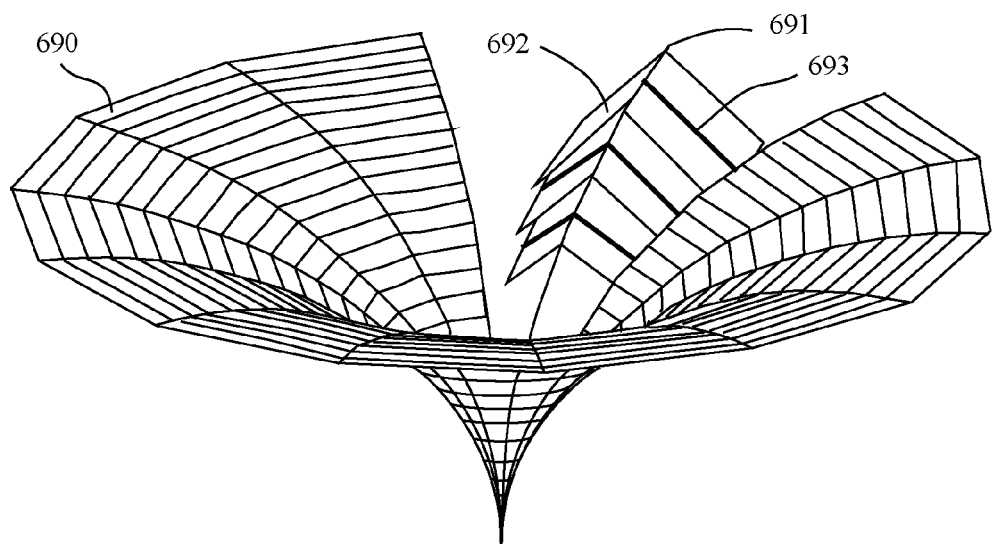
FIG. 43 is a perspective view of the construction of a V-groove on a curved surface according to the present invention.

FIG. 43 is a perspective view of the construction of a V-groove on a curved surface according to the present invention.

In modifying surface 683 of FIG. 42a to become like radial-groove array 670 of FIG. 41, the curvature of the crest-lines would make the groove surfaces become non-planar. In fact, such surfaces would be the envelopes of elemental planes coming off each point on the curve at a 45° angle, as shown in FIG. 43. Incompletely swept equiangular spiral surface 690 is identical to surface 683 of FIG. 42a. Part of the sweep is unfinished so that crest-curve 691 can be clearly seen. Tangent to it are three elemental planar ridges 692 with 90° interior angles. Let a crest curve be specified by the parametric function P(t), where t is the path-length along said crest-curve, with normal vector n(t) and binormal vector b(t). Any point X on a 45° plane touching the crest-curve at P(t) is specified by $$(X-P(t)) \cdot (n(t) \pm b(t)) = 0 \quad (1)$$

with the '±' referring to there being two such 45° planes corresponding to the walls of a 90 V-groove. Varying t gives a family of such planes. In order to calculate the envelope surface to this family of planes, differentiate Equation (1) with respect to parameter t, giving $$-\frac{dP(t)}{dt} \cdot (n(t) \pm b(t)) + (X - P(t)) \cdot \left(\frac{dn(t)}{dt} \pm \frac{db(t)}{dt}\right) = 0 \quad (2)$$

The orthogonal vector triad formed by the parametrically specified unit vectors t(t), n(t), and b(t) is called the Frenet frame of the curve it follows as t varies. Each of these three vectors has a definition based on various derivatives of the equation for P(t). Differentiating these definitions with respect to t gives the Frenet equations, well-known in differential geometry. A laborious combination of the Frenet equations with Equation (2), and eliminating t, finally yields $$(X-P(t)) \cdot t(t) = 0 \quad (3)$$

Equation (3) and Equation (1) must be fulfilled simultaneously for each point X of the envelope surface. Equation (3) establishes that the same vector X−P is normal to tangent vector t, while Equation (1) implies that the vector X−P is normal to n±b. Thus X−P, for a point satisfying equations (1) and (3), must be in the direction n−b, because n and b are orthogonal unit vectors so that (n−b)·(n+b)=0, i.e., $$X-P(t)=s(-n(t) \pm b(t)) \quad (4)$$

This is the parametric equation of the two envelope surfaces of the ridge. The radial parameter is t and transverse parameter is s, with one ridge for +b(t) and the other for −b(t). Curves 683c of FIG. 42b will be crest curves if we take s>0 for both ridges (with s=0 for the crest curves) and they will be trough curves if s<0 (with s=0 for the trough curves in this case). More pertinently, $$X(t,s)=P(t)+s(-n(t) \pm b(t)) \quad (5)$$

is the equation of the envelope surface as a function of the crest equation P(t), and its normal and binormal vectors. The parameter s extends to the value of s that at the bottom of the groove, where it meets the corresponding point on the next ridge.

The upshot of this differential-geometry proof is that each of the planes of FIG. 43 contributes thick lines 693 to the envelope surface of the curved V-groove. Thick lines 693 of FIG. 43 in fact represent the second term in Equation (5). If successive lines 693 cross as they issue from closely neighbouring points, then the resultant envelope surface may have ripples or even caustics (which are physically unrealisable). In the present invention, any such mathematical anomalies would be too far from the crest curve to be of relevance.

Figure 44:
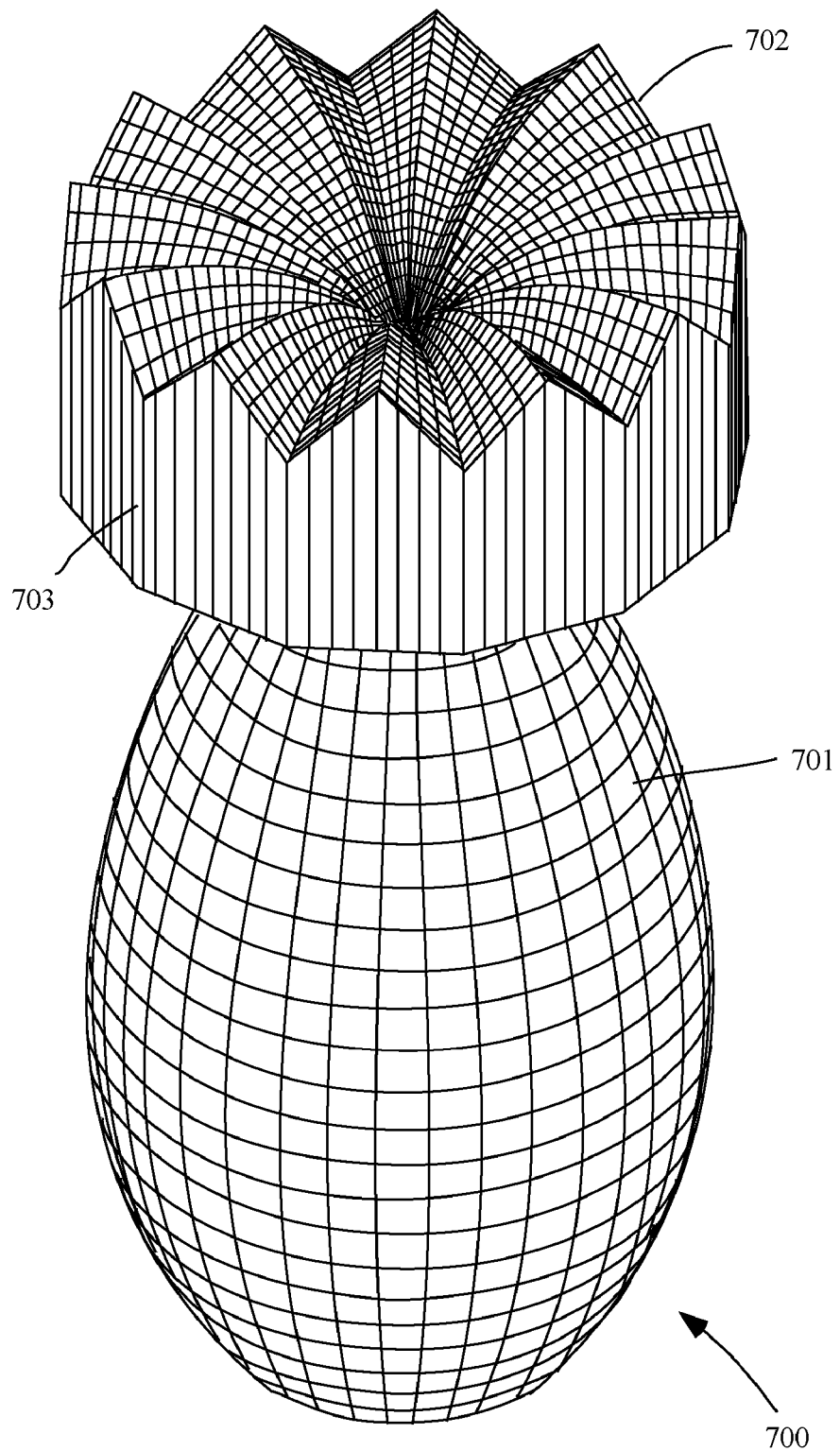
FIG. 44 is a perspective view of a virtual filament with a curved radial V-groove array on top according to the present invention.

FIG. 44 is a perspective view of virtual filament 700, comprising equiangular-spiral transfer section 701, radial V-grooves 702, and cylindrical sidewall 703. Only twelve V-grooves are shown, for the sake of clarity, but an actual device may have many more. The utility of such grooves is that they enable the designer to avoid the use of a coated reflector.

Figure 45:
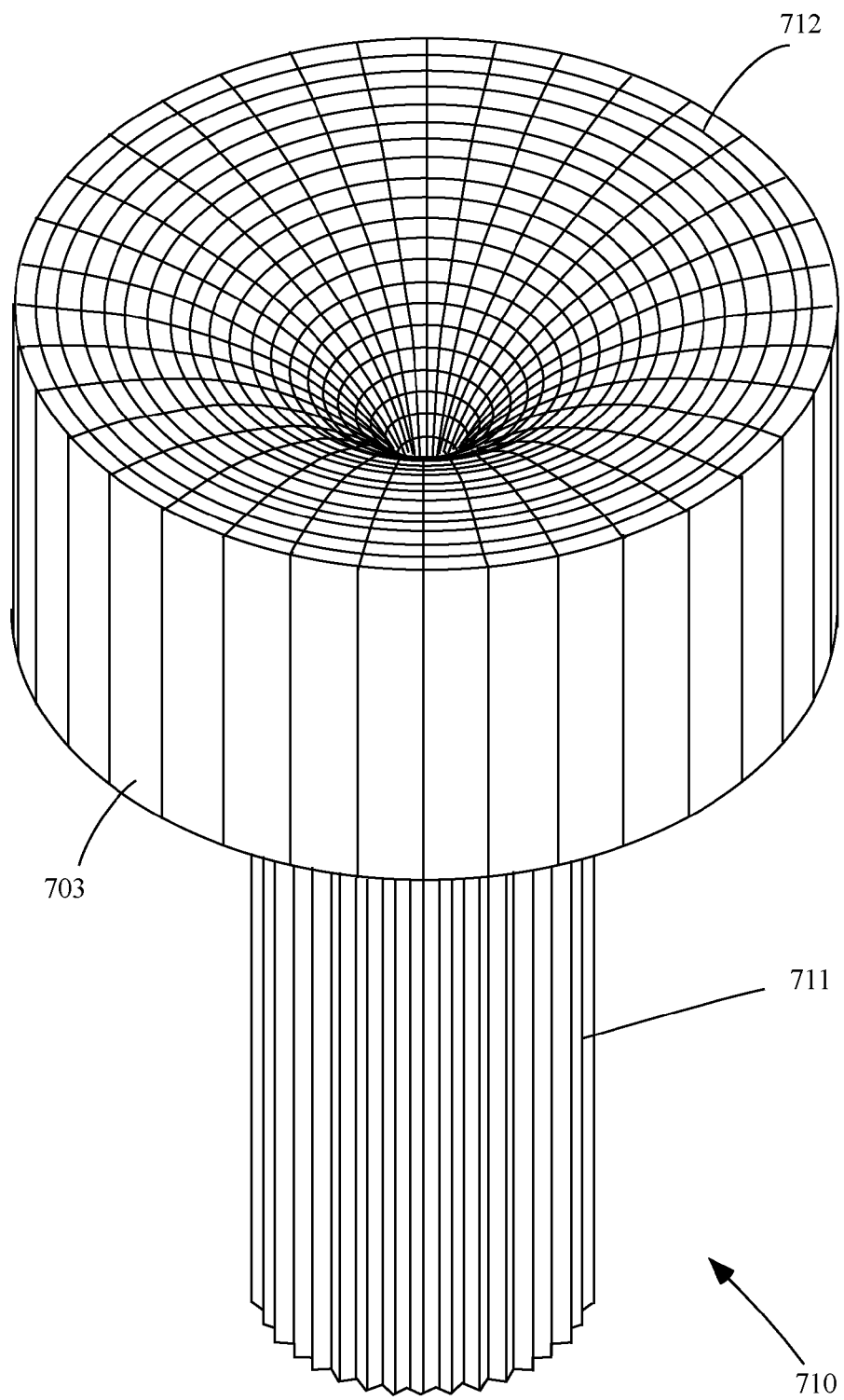
FIG. 45 is a perspective view of a virtual filament with a linear V-groove array on its transfer section according to the present invention.

FIG. 45 shows virtual filament 710, comprising transfer section 711 with longitudinal V-grooves, and ejector section 703. As shown in FIG. 45, V-grooves can also be used on the transfer section of the present invention, enabling a cylindrical shape to be used.

The discussion of FIG. 2 of U.S. patent application Ser. No. 10/461,557 touched on the function of color mixing, to make different wavelengths from chips 23, 24, and 25 have the same relative strengths throughout the light coming out of ejector section 12. This assures that viewers will see only the intended metameric hue and not any colors of the individual chips. Previously, rectangular mixing rods have been used to transform the round focal spot of an ellipsoidal lamp into a uniformly illuminated rectangle, typically in cinema projectors. Generally, polygonal mixing rods worked best with an even number of sides, particularly four and six. With color mixing for LEDs, however, such rods are inefficient because half of an LED's Lambertian emission will escape from the base of the rod.

The following preferred embodiments of the present invention remedy this deficit by proper shaping of its transfer section. This shaping enables polygonal cross-sections to be used in the present invention.

Figure 46:
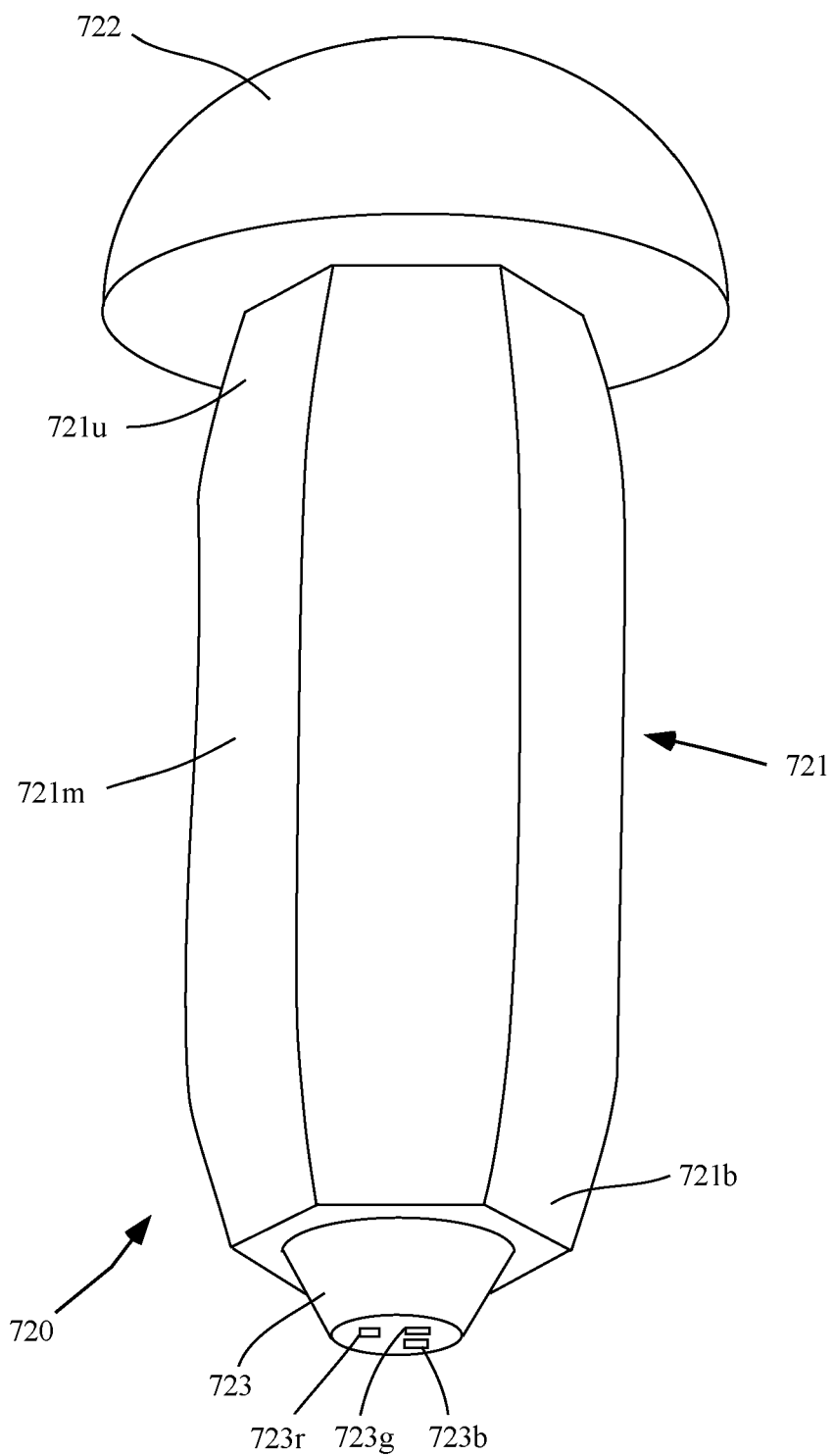
FIG. 46 is a perspective view of a six-sided barrel-shaped virtual filament according to the present invention.

FIG. 46 depicts virtual filament 720, comprising hexagonal transfer section 721 and hemispheric ejector section 722. Within package 723 are red LED chip 723r, green chip 723g, and blue chip 723b. Transfer section 721 comprises expanding bottom section 721b, mid-section 721m with constant cross-section, and contracting upper section 721u. The shape of sections 721b and 721u acts to prevent the escape of rays that a constant cross section would allow if it extended the entire length of transfer section 721. Similar to the grooves of FIG. 44 and FIG. 45, a polygonal transfer section would constitute a departure from complete rotational symmetry.

Figure 47A:
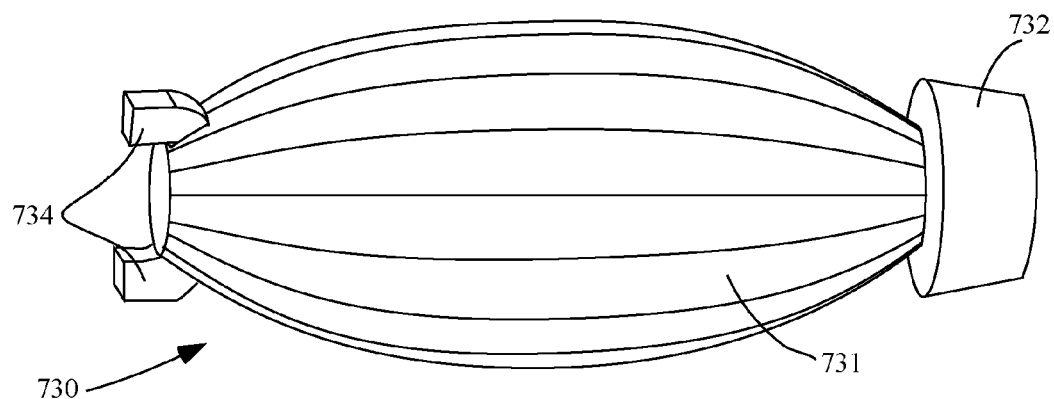
FIGS. 47a and 47b is a side and perspective view, respectively, of a sixteen-sided virtual filament according to the present invention.
Figure 47B:
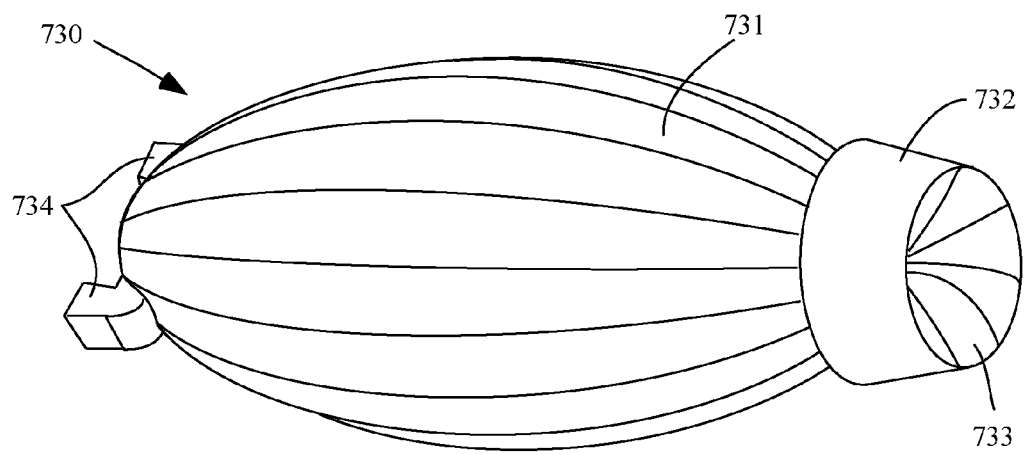
Figure 47C:
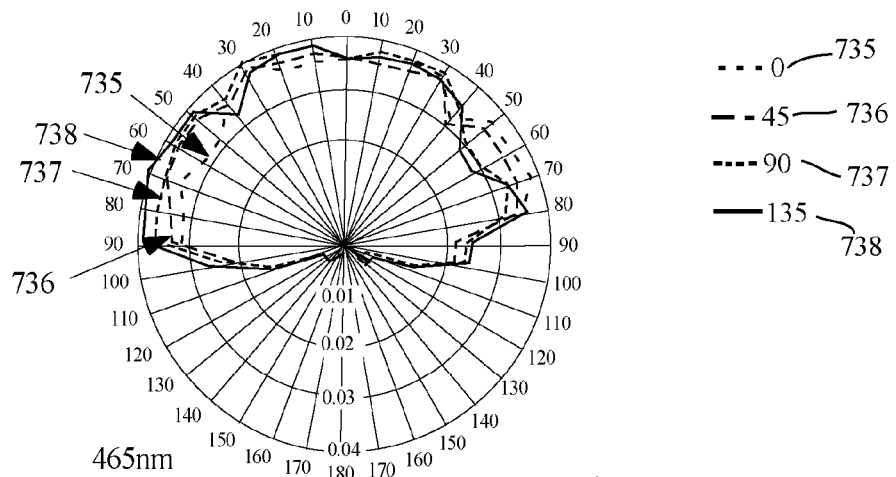
FIG. 47c-e show blue (465 nanometers), green (520 nanometers) and red (620 nanometers) emission patterns, respectively, of the embodiments of FIGS. 47a-b, at the various cylindrical azimuths.
Figure 47D:
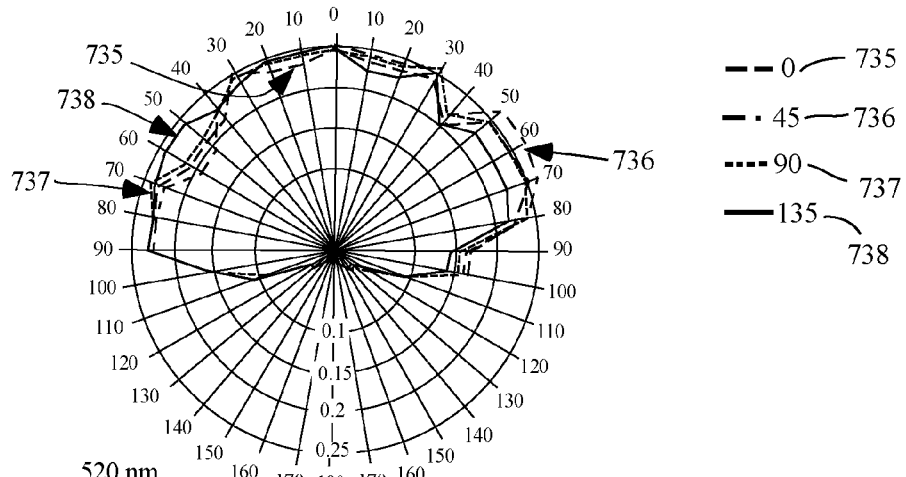
Figure 47E:
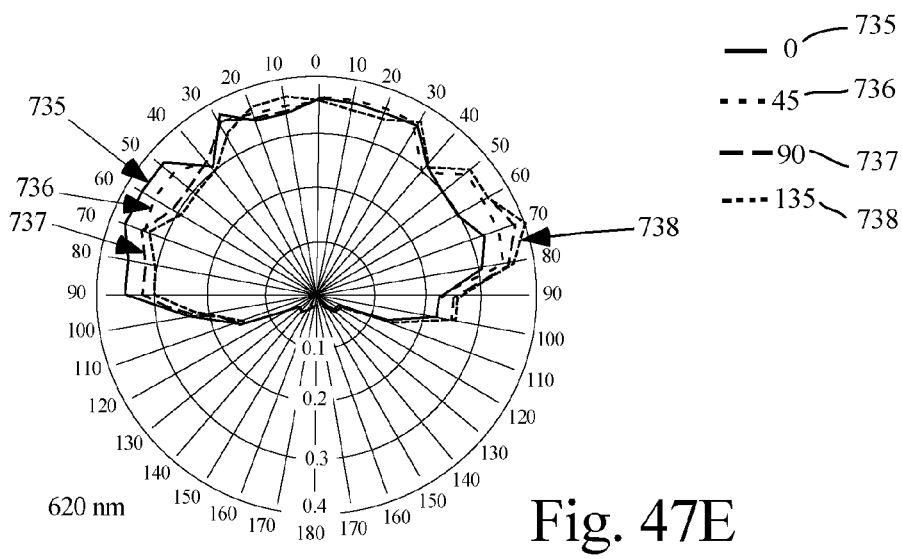

FIG. 47a is a side view of virtual filament 730 comprising sixteen-sided off-axis ellipsoid 731, conical ejector section 732, and mounting feet 734. FIG. 47b is a perspective view of the same preferred embodiment, also showing spline top surface 733. FIG. 47c shows the blue (465 nanometers) emission pattern of this preferred embodiment, at the various cylindrical azimuths, 0° azimuth indicated by reference numeral 735, 45° azimuth indicated by reference numeral 736, 90° azimuth indicated by reference numeral 737, and 135° azimuth indicated by reference numeral 738, and as indicated in the legend at upper right. FIG. 47d shows the green (520 nanometers) emission pattern of this preferred embodiment, at the various cylindrical azimuths 735-738 and as indicated in the legend at upper right. FIG. 47E shows the red (620 nanometers) emission pattern of this preferred embodiment, at the various cylindrical azimuths 735-738 and as indicated in the legend at upper right.

Figure 48A:
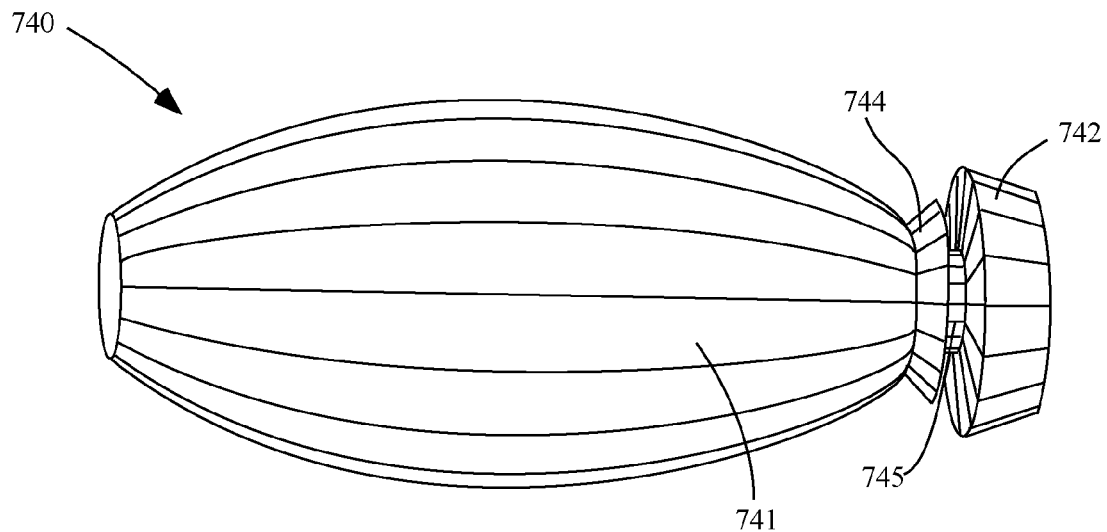
FIGS. 48a and 48b is a side and perspective view, respectively, of another sixteen-sided virtual filament, with a slotted ejector section according to the present invention.
Figure 48B:
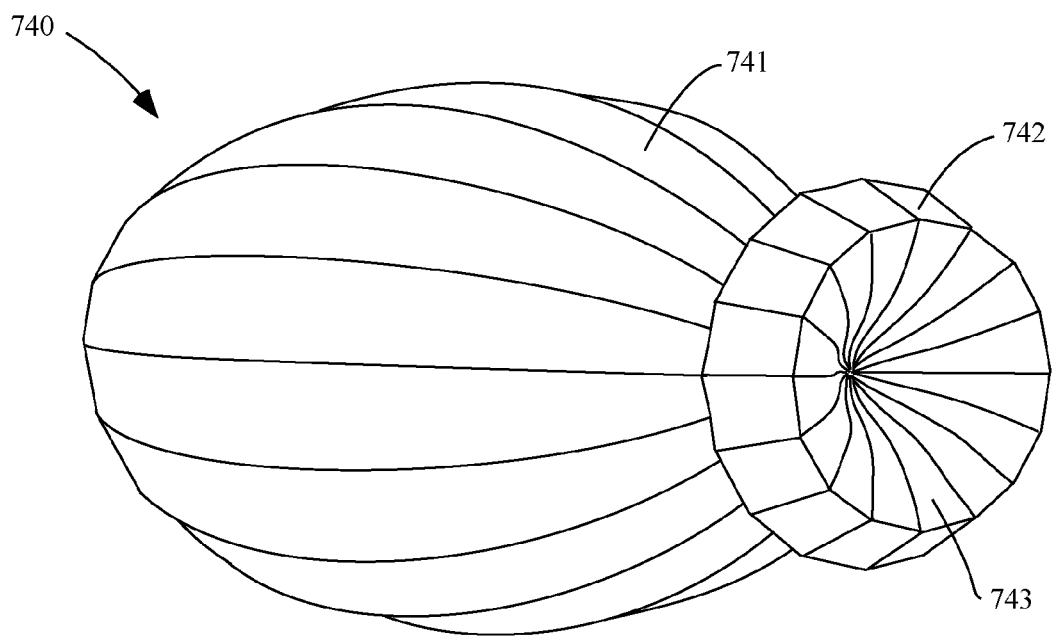
Figure 48C:
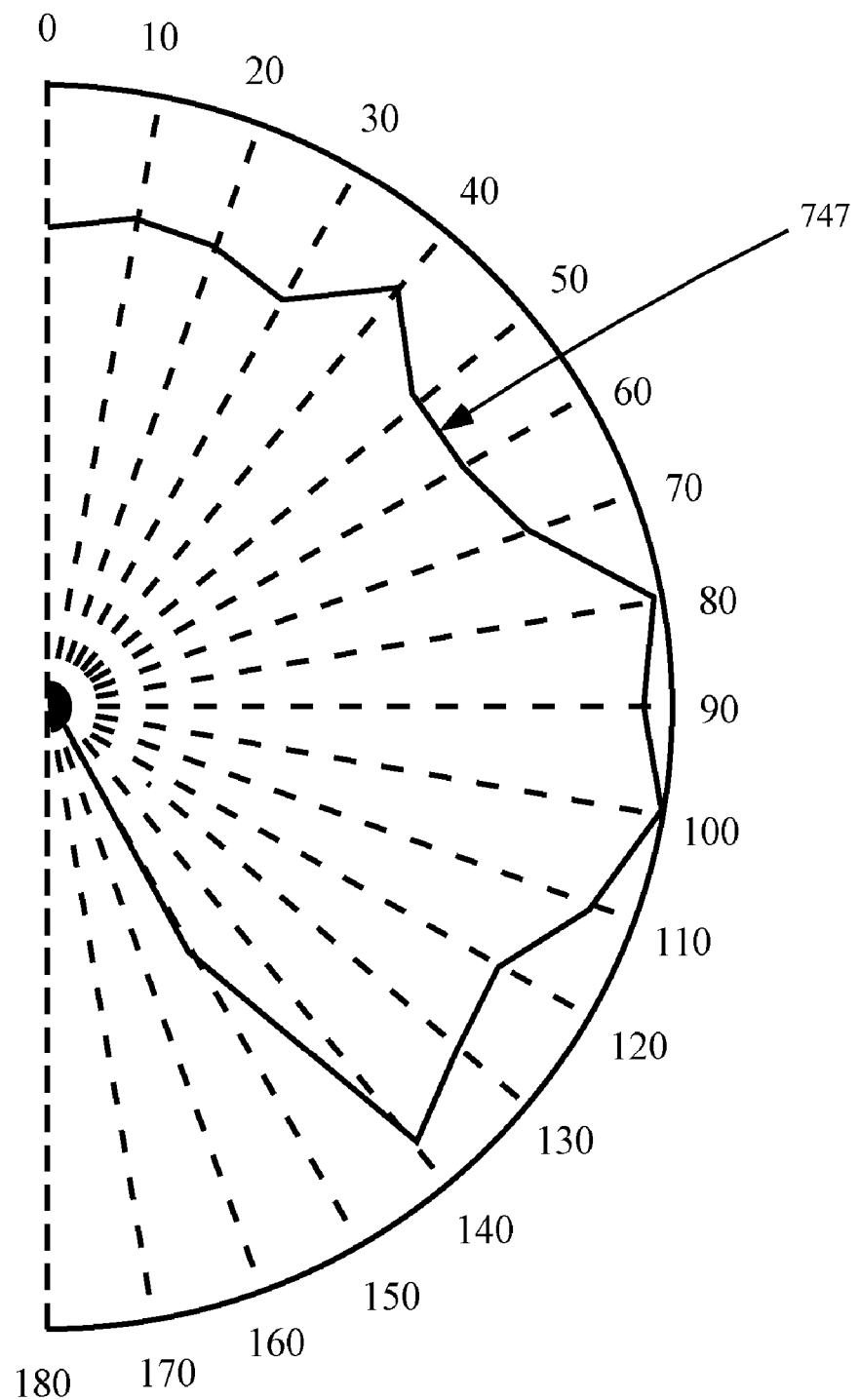

FIG. 48a is a side view of virtual filament 740 comprising sixteen-sided off-axis ellipsoid 741, conical ejector section 742, conical collar 744, and cylindrical connector 745. FIG. 48b is a perspective view of the same preferred embodiment 743. The purpose of the narrowing by collar 744 is to produce the 300° emission pattern 747 shown in FIG. 48c.

Figure 49A:
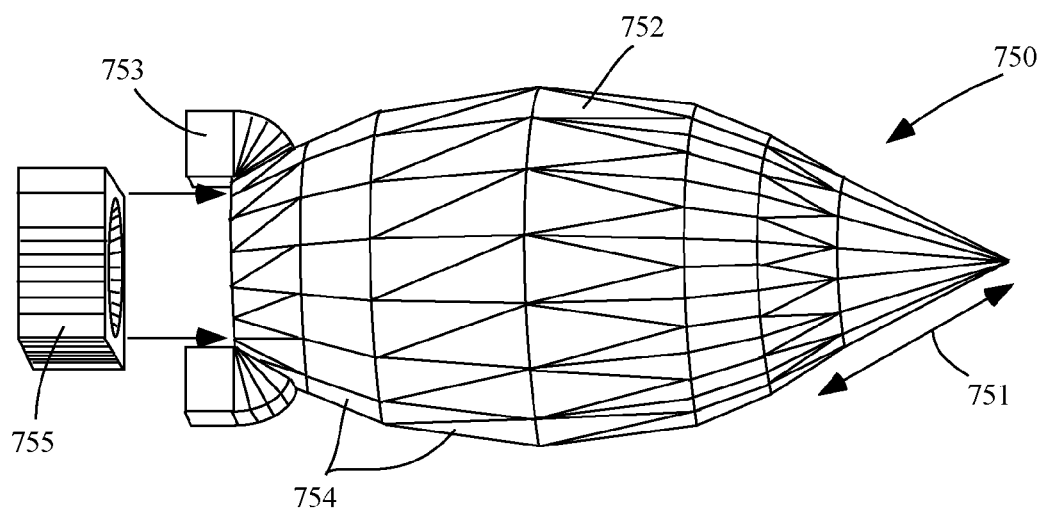
FIGS. 49a and 49b is a side and perspective view, respectively, of a faceted virtual filament that mixes the disparate wavelengths of a tricolor LED according to the present invention.

FIG. 49a is an exploded side view of faceted virtual filament 750 and tricolor LED package 755 being inserted into and optically coupled to the filament 750. Beyond polygonally-shaped transfer sections are more complex departures from circular symmetry. Virtual filament 750 comprises an output section spanned by arrow 751, transfer section 752, and mounting feet 753. Faceted virtual filament 750 is a single piece of plastic, such as acrylic, the surface of which is covered by planar facets 754. The two mounting feet 753 are designed to be proximate to the outer surfaces of LED package 755, to aid in alignment and bonding of virtual filament 750 to package 755. In one embodiment of the invention, adhesive is applied to the inner sidewalls of feet 753 for bonding to LED package 755. In this instance the inner sidewall of each leg 753 has a surface that is substantially parallel to the proximate edge surface of LED package 755. Optical coupling of the bottom of virtual filament 750 to the top surface of LED package 755 can be achieved by several means, such as use of optical adhesives, non-curing and curing optical gels (such as available from Nye Optical Products of Fairhaven, Mass.) or index matching liquids (such as available from Cargille Laboratories of Cedar Grove, N.J.).

Figure 49B:
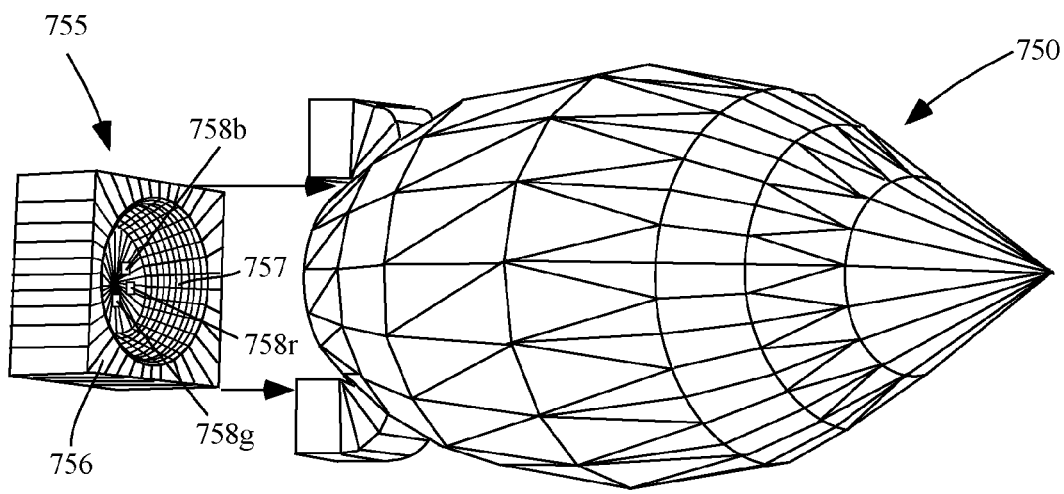

FIG. 49b is an exploded-part perspective view showing rectangular LED package 755 as removed from virtual filament 750. Within reflector cup 757 are red chip 758r, green chip 758g, and blue chip 758b. Cup 757 is filled with transparent epoxy (not shown) up to top 756 of package 755. Top 756 is optically bonded to the bottom of faceted virtual filament 750. This three-chip configuration is an example of the present invention incorporating multiple light sources. The three chips shown could also be amber, red, and infrared, suitable for illuminators compatible with night-vision devices, and other combinations.

Typically the base of a mixing virtual filament is larger than the emitting surface of the RGB LED illuminating it. In one preferred embodiment the inner diameter of the sixteen-sided polygonal shaped base of the mixing optic 750 is 20% larger than the diameter of the circular exit aperture of the RGB LED 755. In the case where the RGB LED 755 has a non-circular exit aperture, the base of the virtual filament is made sufficiently large to completely cover the exit aperture of the LED.

Figure 50:
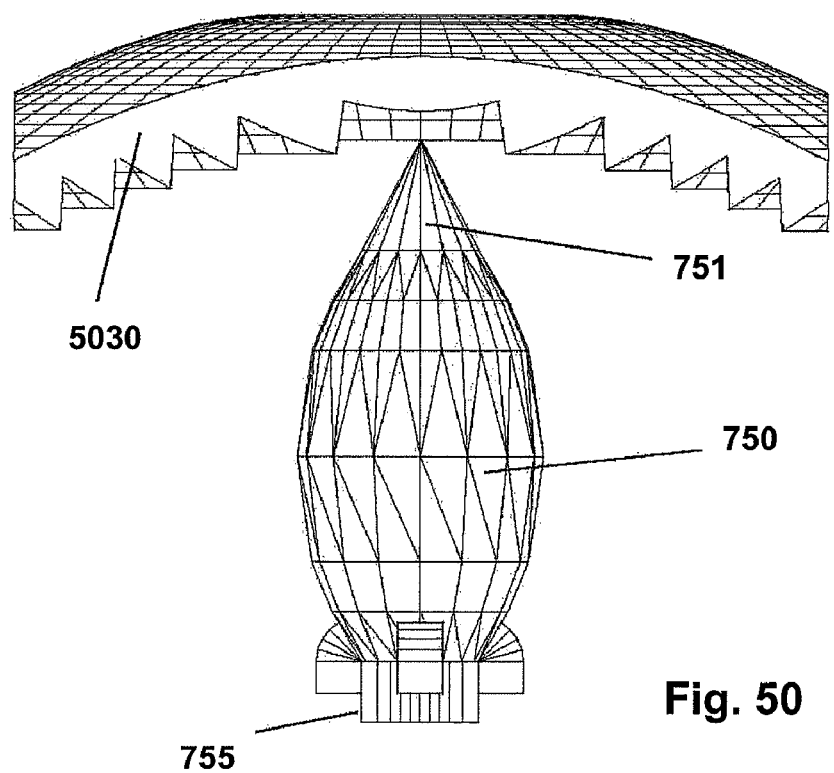
FIG. 50 depicts a side view of the faceted virtual filament of FIGS. 49a and 49b and a rectangularly cut collimating totally internally reflecting (TIR) lens focused on its output section.

FIG. 50 is a side view showing TIR lens 5030 with its focus at output section 751 of faceted virtual filament 750.

Figure 51:
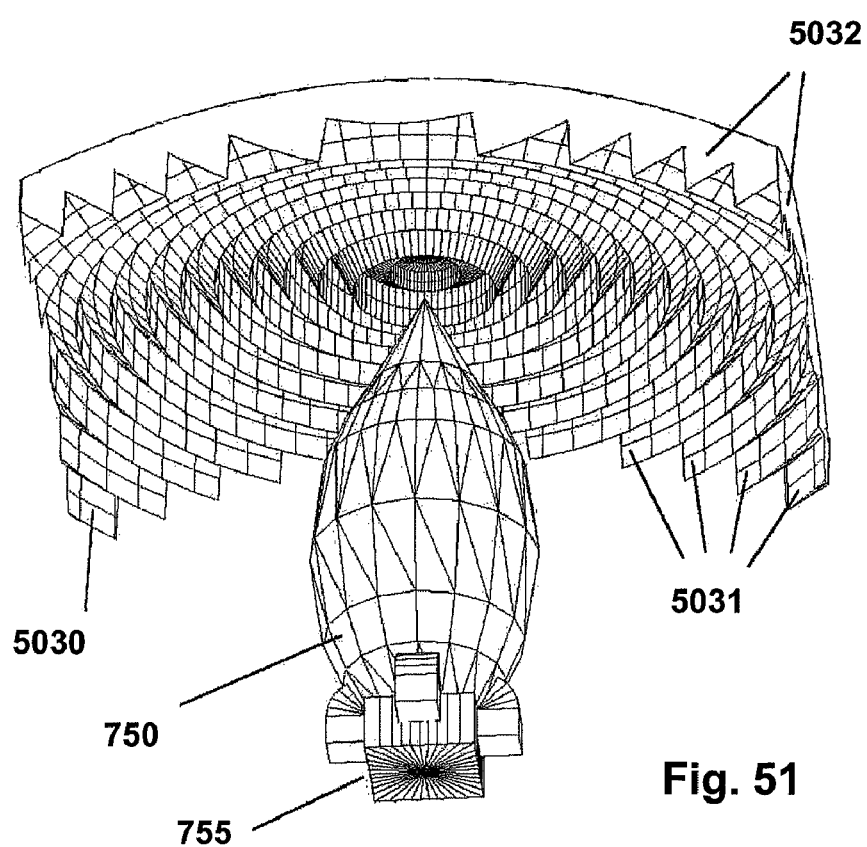
FIGS. 51-53 depicts perspective views of the faceted virtual filament and the rectangularly cut collimating TIR lens of FIG. 50 as seen from three different angles.

FIG. 51 is a view from below also showing faceted virtual filament 750, LED package 755, and TIR lens 5030, the latter comprising facets 5031 and flat cut-out planes 5032.

Figure 52:
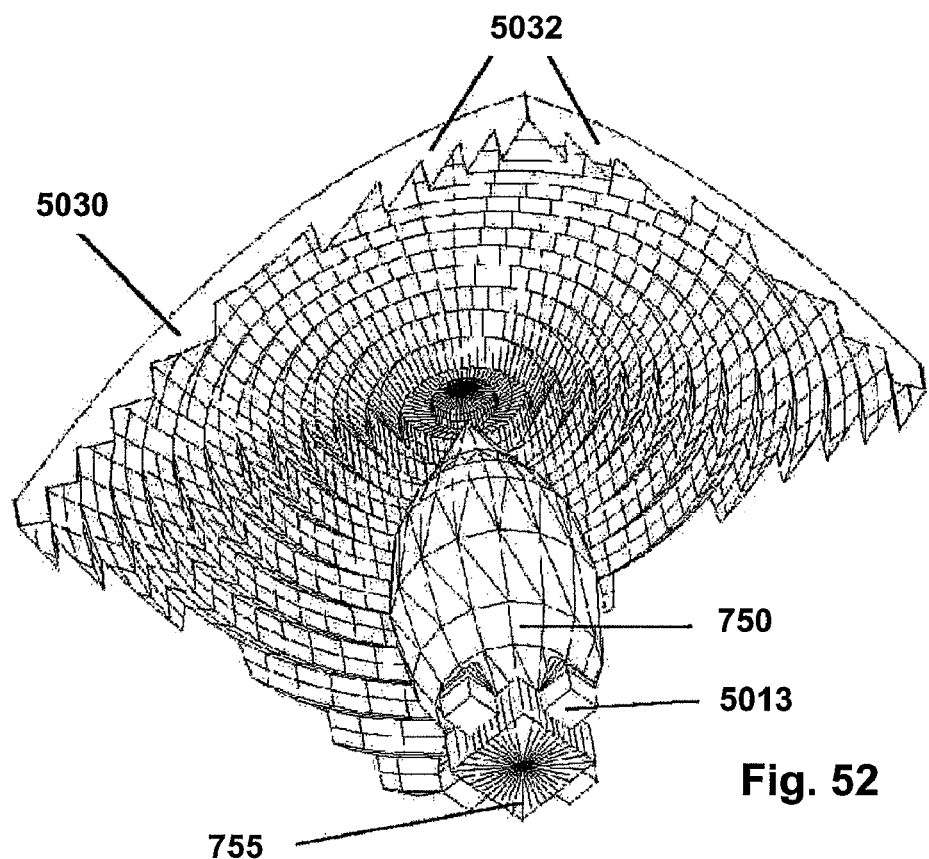

FIG. 52 shows the rectangular shape of TIR lens 5030, positioned above faceted virtual filament 750. Also shown is LED package 755 coupled to the bottom of virtual filament 750. There are four mounting feet 5013, somewhat smaller than the two shown in FIG. 49A, so as not to leak a greater amount of light from LED 755.

Figure 53:
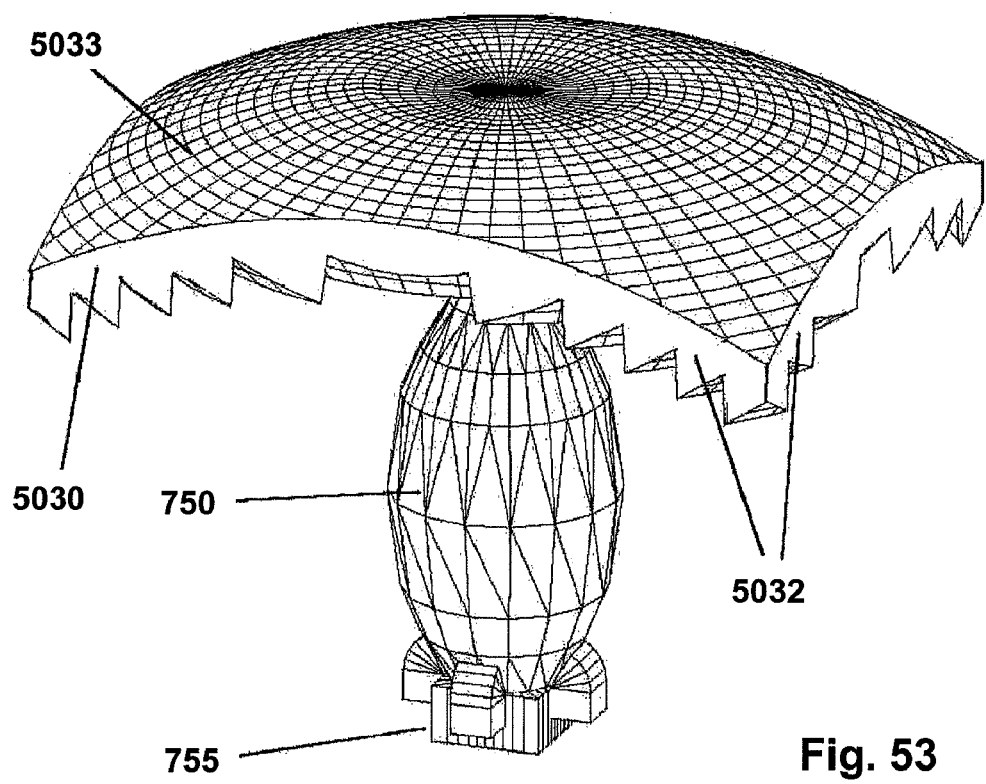

FIG. 53 is a perspective view from above showing virtual filament 750 and LED package 755. Rectangularly cut TIR lens 5030 has planar side walls 5032 and slightly indented upper surface 5033.

Figure 54:
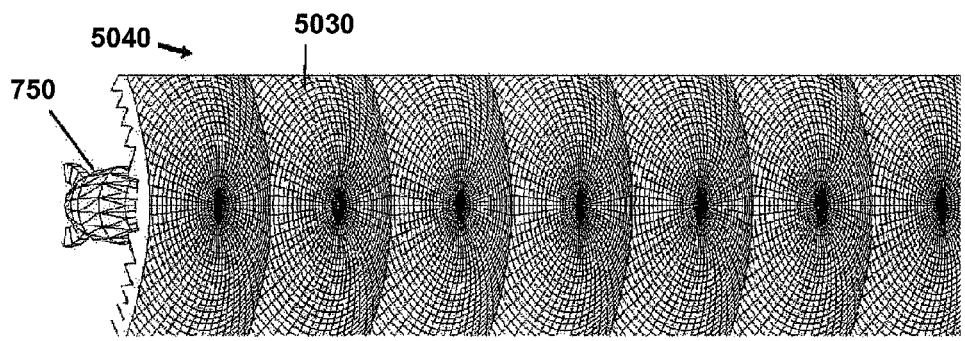
FIG. 54 shows a perspective view of a plurality of the faceted virtual filament and collimating TIR lenses of FIG. 50 cooperated in a row.

FIG. 54 shows lens 5040 comprising a row of rectangular TIR lenses 5030, and endmost virtual filament 750.

Figure 55:
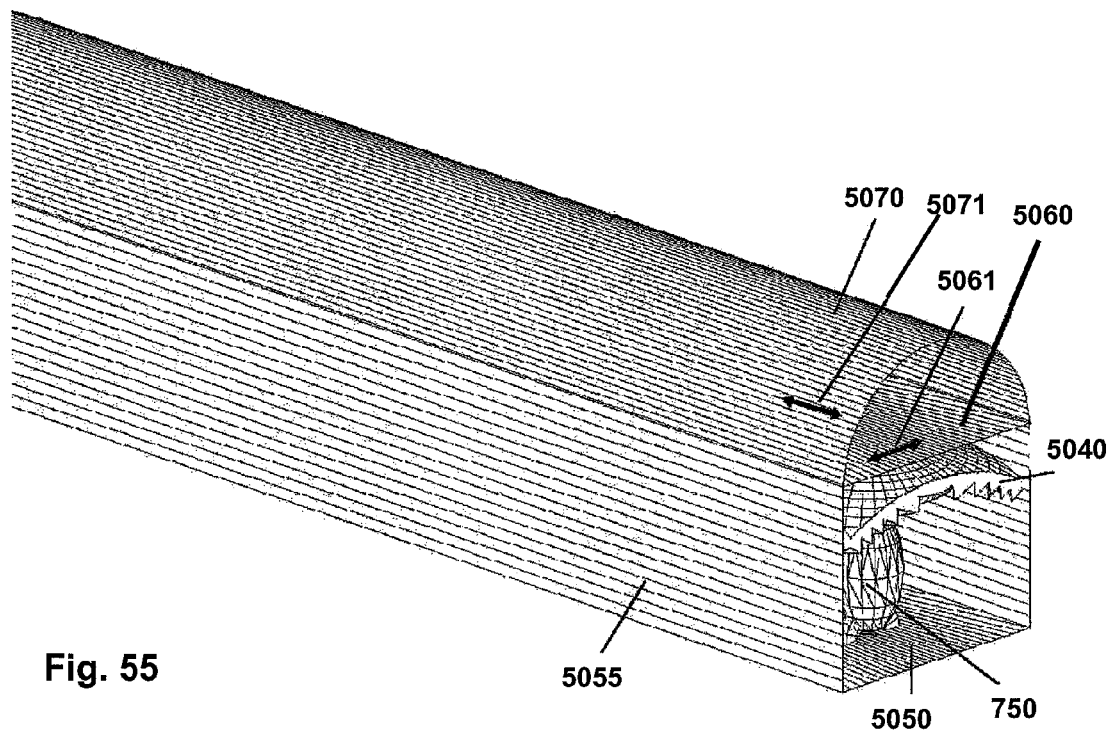
FIG. 55 shows a luminaire for a row shown in FIG. 54.

FIG. 55 shows endmost virtual filament 750 and circuit board 5050 upon which it is mounted. Sidewalls 5055 hold row lens 5040, flat holographic diffuser 5060 just above it, and outer cover 5070, which is optionally a holographic diffuser. Transverse arrow 5061 shows the long axis of the elliptical pattern of holographic diffuser 5060. Longitudinal arrow 5071 shows the long axis of the elliptical pattern of a holographic diffuser deployed on cover 5070. These diffusers cause a distant viewer to see a narrow line of light on cover 5070. It will have the color of the metameteric resultant of the component colors mixed by faceted virtual filament 750.

Figure 56:
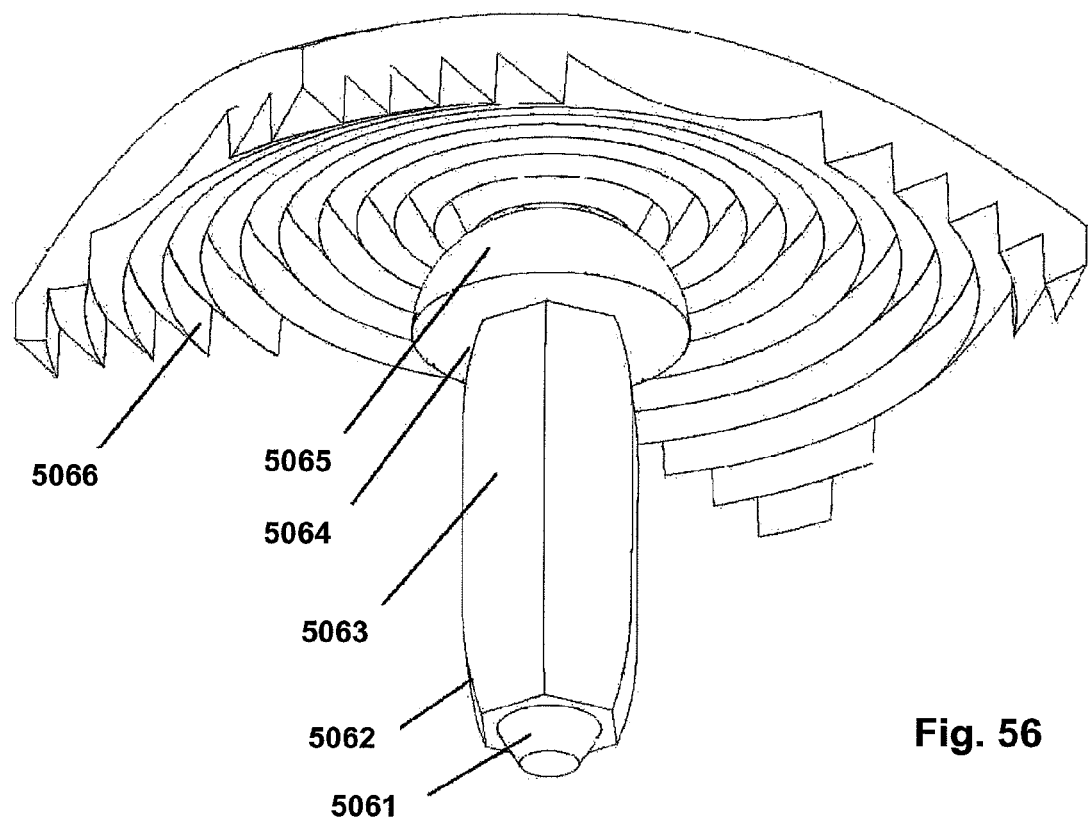
FIG. 56 shows an alternative virtual filament cooperated with a TIR lens.

FIG. 56 shows an alternative virtual filament configuration. Reflector cup 5061 is analogous to reflector cup 21 of FIG. 49B, in that it contains the system's light-emitting chips. Six-fold compound parabolic concentrator (CPC) section 5062 widens to hexagonal rod 5063. This CPC section can alternatively be a combination of an equiangular and a parabolic curve, hereinafter referred to as an equiangular-spiral concentrator, to avoid leakage. At the top of rod 5063, another parabolic (or equiangular spiral) section 5064 narrows the rod again. This widens the angular swath of light from the range of guided angles, about ±48°, to about the full ±90° of LED package 755. Other even-polygon cross sections for the rod can also be used. Connected to rod 5063 is hemispheric lens 5065, positioned just under rectangular TIR lens 5066 and delivering light thereinto. Sections 5062, 5063, 5064 and 5065 can, in some embodiments, be formed all of one piece of transparent plastic, such as acrylic or polycarbonate. Light received into section 5062 is mixed by section 5063 and emitted out section 5065 into collimating lens 5066.

While the invention herein disclosed has been described by means of specific embodiments and applications thereof, numerous modifications and variations could be made thereto by those skilled in the art without departing from the scope of the invention as set forth in the claims.

What is claimed is:

1. An optical device for distributing the radiant emission of a light emitter comprising:
   a lower substantially cylindrical transfer section comprising a solid of dielectric;
   an upper ejector section situated upon the lower transfer section, said lower transfer section operable for placement upon the light emitter and operable to transfer the radiant emission to said upper ejector section such that the radiant emission received from the light emitter enters the lower transfer section at a first end of the lower transfer section and substantially all of the radiant emission is transferred to an opposite second end of the lower transfer section to be delivered from the second end of the lower transfer section to the upper ejector section, wherein the first end is separated from the second end by a length of the lower transfer section; and said upper ejector section shaped such that the emission is redistributed externally into a substantial solid angle, and wherein a surface of said transfer section is comprised of an array of V-grooves.

2. The optical device of claim 1, wherein V-grooves define an exterior circumferential surface of the transfer section.

3. The optical device of claim 2, wherein the V-grooves extend along the length of the transfer section parallel with a central rotational axis of the cylindrical transfer section.

4. The optical device of claim 2, wherein said ejector section comprises:

a non-ejecting surface; and a generally cylindrical ejecting surface through which the radiant emission, transferred through the transfer section to the upper ejector section, is emitted, externally into the substantial solid angle, where the cylindrical ejecting surface is parallel with a central axis of the cylindrical transfer section.

5. The optical device of claim 1, wherein the upper ejector section further comprises a generally cylindrical ejecting surface through which the radiant emission, transferred through the transfer section to the upper ejector section, is emitted, externally into the substantial solid angle, through the cylindrical ejecting surface.

6. The optical device of claim 1, wherein the transfer section is rotationally symmetrical about an axis; and the upper ejector section comprising a generally cylindrical surface through which the radiant emission, transferred through the transfer section to the upper ejector section, is emitted externally into the substantial solid angle, and where the cylindrical surface is parallel with the axis.

7. The optical device of claim 6, wherein said transfer section is generally cylindrical and the array of V-grooves defines an exterior circumferential surface of the transfer section and the V-grooves extend along the length of the transfer section parallel with the axis of the cylindrical transfer section.

8. An optical device for distributing radiant emissions of a light emitter, the optical device comprising:

a substantially cylindrical transfer section comprising a solid dielectric;

an ejector section situated upon the transfer section, said transfer section operable for placement adjacent with a light emitter and operable to transfer radiant emission from said light emitter to said ejector section such that the radiant emission received from the light emitter enters the transfer section at a first end of the transfer section and substantially all of the radiant emission is transferred to an opposite second end of the transfer section to be delivered from the second end of the transfer section to the ejector section, wherein the first end is separated from the second end by a length of the transfer section; and said ejector section shaped such that the emission is redistributed externally into a substantial solid angle, and where a surface of said transfer section comprises an array of V-grooves.

9. The optical device of claim 8, wherein the transfer section is rotationally symmetrical about an axis;

the upper ejector section comprising a generally cylindrical ejecting surface through which the radiant emission, transferred through the transfer section to the upper ejector section, is emitted externally into the substantial solid angle, and where the cylindrical ejecting surface is parallel with the axis.

10. The optical device of claim 8, wherein an array of V-grooves extends about a circumference of the transfer section.

11. The optical device of claim 10, wherein the V-grooves extend along the length of the transfer section parallel with a central rotational axis of the cylindrical transfer section.

12. An optical device for distributing radiant emissions of a light emitter, the optical device comprising:

a cylindrical transfer section that is rotationally symmetric about a central axis, where said transfer section is configured to be positioned adjacent a light emitter to receive radiant emission from said light emitter; and an ejector section, situated upon the transfer section, rotationally symmetric about the central axis;

where said transfer section is shaped such that the radiant emission received from the light emitter enters the transfer section at a first end of the transfer section to transfer substantially all of said radiant emission received from said light emitter generally in parallel with the central axis to an opposite second end of the transfer section to be delivered from the second end of the transfer section to said ejector section, wherein the first end is separated from the second end by a length of the transfer section; and said ejector section is shaped such that the radiant emission is redistributed externally into a substantial solid angle.

13. The optical device of claim 12, wherein the transfer section comprises an array of V-grooves that defines an exterior surface of the transfer section.

* * * * *